(12) United States Patent
Wang et al.

(10) Patent No.: US 12,057,342 B2
(45) Date of Patent: Aug. 6, 2024

(54) SEMICONDUCTOR DEVICE AND METHOD

(71) Applicant: Taiwan Semiconductor Manufacturing Co., Ltd., Hsinchu (TW)

(72) Inventors: Shiang-Bau Wang, Pingzchen (TW); Chun-Hung Lee, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 0 days.

(21) Appl. No.: 18/064,783

(22) Filed: Dec. 12, 2022

(65) Prior Publication Data

US 2023/0113320 A1 Apr. 13, 2023

Related U.S. Application Data

(60) Continuation of application No. 17/101,131, filed on Nov. 23, 2020, now Pat. No. 11,527,430, which is a
(Continued)

(51) Int. Cl.
*H01L 21/762* (2006.01)
*H01L 21/3105* (2006.01)
(Continued)

(52) U.S. Cl.
CPC .. *H01L 21/76229* (2013.01); *H01L 21/31053* (2013.01); *H01L 21/76232* (2013.01); *H01L 21/823418* (2013.01); *H01L 21/823431* (2013.01); *H01L 21/823481* (2013.01); *H01L 21/823814* (2013.01); *H01L 21/823821* (2013.01); *H01L 21/823878* (2013.01); *H01L 27/0886* (2013.01); *H01L 27/0924* (2013.01); *H01L 21/02164* (2013.01); *H01L 21/0217* (2013.01); *H01L 21/02282* (2013.01); *H01L 21/02337* (2013.01); *H01L 21/02356* (2013.01); *H01L 21/31111* (2013.01); *H01L 21/31116* (2013.01)

(58) Field of Classification Search
CPC ....... H01L 21/76229; H01L 21/823431; H01L 21/823821; H01L 27/0886; H01L 27/0924; H01L 29/6681; H01L 21/823878; H01L 21/823481
See application file for complete search history.

(56) References Cited

U.S. PATENT DOCUMENTS 6,737,330 B2 5/2004 Park
8,709,901 B1 4/2014 Chang et al.
(Continued)

*Primary Examiner* — Bac H Au
(74) *Attorney, Agent, or Firm* — Slater Matsil, LLP

(57) ABSTRACT

A method for shallow trench isolation structures in a semiconductor device and a semiconductor device including the shallow trench isolation structures are disclosed. In an embodiment, the method may include forming a trench in a substrate; depositing a first dielectric liner in the trench; depositing a first shallow trench isolation (STI) material over the first dielectric liner, the first STI material being deposited as a conformal layer; etching the first STI material; depositing a second STI material over the first STI material, the second STI material being deposited as a flowable material; and planarizing the second STI material such that top surfaces of the second STI material are co-planar with top surfaces of the substrate.

20 Claims, 34 Drawing Sheets

Related U.S. Application Data division of application No. 16/178,073, filed on Nov. 1, 2018, now Pat. No. 10,847,409.

(60) Provisional application No. 62/737,659, filed on Sep. 27, 2018.

(51) Int. Cl.
| | | |
|---|---|---|
| *H01L 21/8234* | (2006.01) | |
| *H01L 21/8238* | (2006.01) | |
| *H01L 27/088* | (2006.01) | |
| *H01L 27/092* | (2006.01) | |
| *H01L 21/02* | (2006.01) | |
| *H01L 21/311* | (2006.01) | |

(56) References Cited

U.S. PATENT DOCUMENTS

| | | |
|---|---|---|
| 9,214,358 B1 | 12/2015 | Lin et al. |
| 9,799,570 B1 | 10/2017 | Cheng |
| 10,157,770 B2 | 12/2018 | Wu et al. |
| 10,340,193 B2 | 7/2019 | Yeh et al. |
| 10,586,859 B2 | 3/2020 | Wang |
| 2003/0013272 A1 | 1/2003 | Hong et al. |
| 2006/0043529 A1 | 3/2006 | Chidambarrao et al. |
| 2012/0276713 A1 | 11/2012 | Miyahara et al. |
| 2017/0033220 A1 | 2/2017 | Fung et al. |
| 2018/0151414 A1 | 5/2018 | Wu et al. |
| 2019/0043857 A1 | 2/2019 | Wu et al. |
| 2019/0103325 A1 | 4/2019 | Huang et al. |
| 2019/0148235 A1 | 5/2019 | Wang |
| 2020/0105589 A1 | 4/2020 | Tsai et al. |
| 2020/0126868 A1 | 4/2020 | Wang et al. |

SEMICONDUCTOR DEVICE AND METHOD

CROSS-REFERENCE TO RELATED APPLICATIONS

This application is a continuation of U.S. patent application Ser. No. 17/101,131 (now U.S. Pat. No. 11,527,430, issued Dec. 13, 2022), filed Nov. 23, 2020 which is a divisional application of U.S. patent application Ser. No. 16/178,073 (now U.S. Pat. No. 10,847,409, issued Nov. 24, 2020), filed on Nov. 1, 2018 and entitled "Semiconductor Device and Method," which claims the benefit of U.S. Provisional Patent Application No. 62/737,659, filed on Sep. 27, 2018 and entitled "Semiconductor Device and Method," which patent applications are incorporated herein by reference.

BACKGROUND

Semiconductor devices are used in a variety of electronic applications, such as, for example, personal computers, cell phones, digital cameras, and other electronic equipment. Semiconductor devices are typically fabricated by sequentially depositing insulating or dielectric layers, conductive layers, and semiconductor layers of material over a semiconductor substrate, and patterning the various material layers using lithography to form circuit components and elements thereon.

The semiconductor industry continues to improve the integration density of various electronic components (e.g., transistors, diodes, resistors, capacitors, etc.) by continual reductions in minimum feature size, which allow more components to be integrated into a given area. However, as the minimum features sizes are reduced, additional problems arise that should be addressed.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
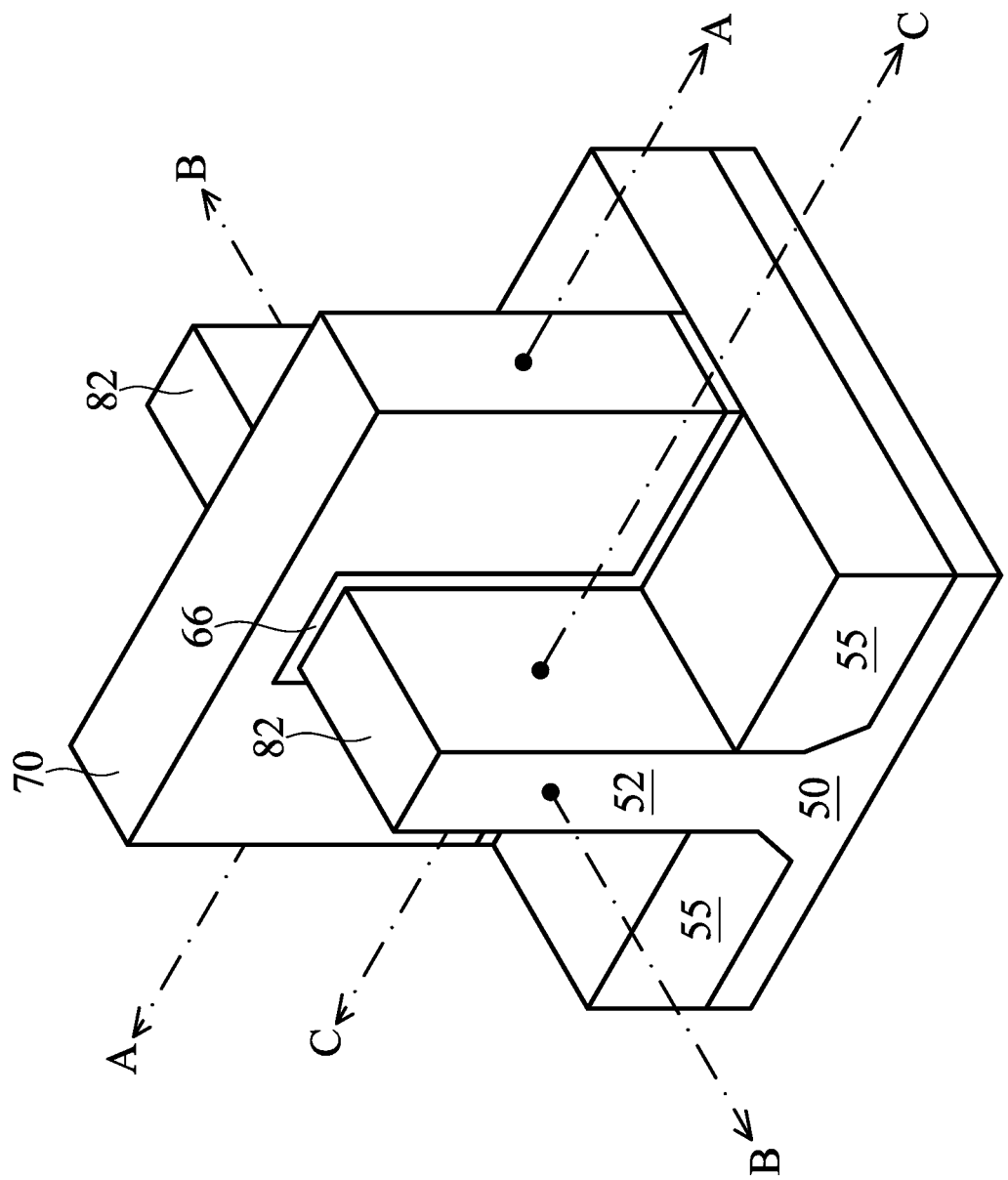
FIG. 1 illustrates a three-dimensional view of a FinFET in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Various embodiments provide processes for forming semiconductor devices having reduced fin depth loading. For example, a first shallow trench isolation (STI) material may be deposited in recesses formed adjacent to fins, the first STI material may be etched, and a second STI material may be deposited over the first STI material. The second STI material may be deposited as a flowable material (e.g., a liquid material), and may be formed without seams or voids formed therein. The second STI material may then be etched to form STI regions without recess depth loading. Semiconductor devices manufactured according to embodiments of the present application may experience reduced defects as well as improved device performance.

FIG. 1 illustrates an example of a FinFET in a three-dimensional view for reference, in accordance with some embodiments. The FinFET comprises a fin 52 on a substrate 50 (e.g., a semiconductor substrate). Isolation regions 55 are disposed in the substrate 50, and the fin 52 protrudes above and from between neighboring isolation regions 55. Although the isolation regions 55 are described and illustrated as being separate from the substrate 50, as used herein the term "substrate" may be used to refer to just the semiconductor substrate or a semiconductor substrate inclusive of the isolation regions 56. A gate dielectric layer 92 is along sidewalls and over a top surface of the fin 52, and a gate electrode 94 is over the gate dielectric layer 92. Source/drain regions 82 are disposed in opposite sides of the fin 52 with respect to the gate dielectric layer 92 and gate electrode 94. FIG. 1 further illustrates reference cross-sections that are used in later figures. Cross-section A-A is along a longitudinal axis of the gate electrode 94 and in a direction, for example, perpendicular to the direction of current flow between the source/drain regions 82 of the FinFET. Cross-section B-B is perpendicular to the cross-section A-A and is along a longitudinal axis of the fin 52 and in a direction of, for example, a current flow between the source/drain regions 82 of the FinFET. Cross-section C-C is parallel to the cross-section A-A and extends through one of the source/drain regions 82 of the FinFET. Subsequent figures refer to these reference cross-sections for clarity.

The embodiments discussed herein may be used in FinFETs formed by either a gate-first process or a gate-last process. Also, some embodiments contemplate aspects used in planar devices, such as planar FETs.

FIGS. 2 through 21B are cross-sectional views of intermediate stages in the manufacturing of FinFETs, in accordance with some embodiments. FIGS. 2 through 14 illustrate reference cross-section A-A illustrated in FIG. 1, except for multiple fins/FinFETs. In FIGS. 15A through 21B, figures ending with an "A" designation are illustrated along reference cross-section A-A illustrated in FIG. 1, figures ending with a "B" designation are illustrated along reference cross-section B-B illustrated in FIG. 1, and figures ending with a "C" designation are illustrated along reference cross-section C-C illustrated in FIG. 1, except for multiple fins/FinFETS.

Figure 2:
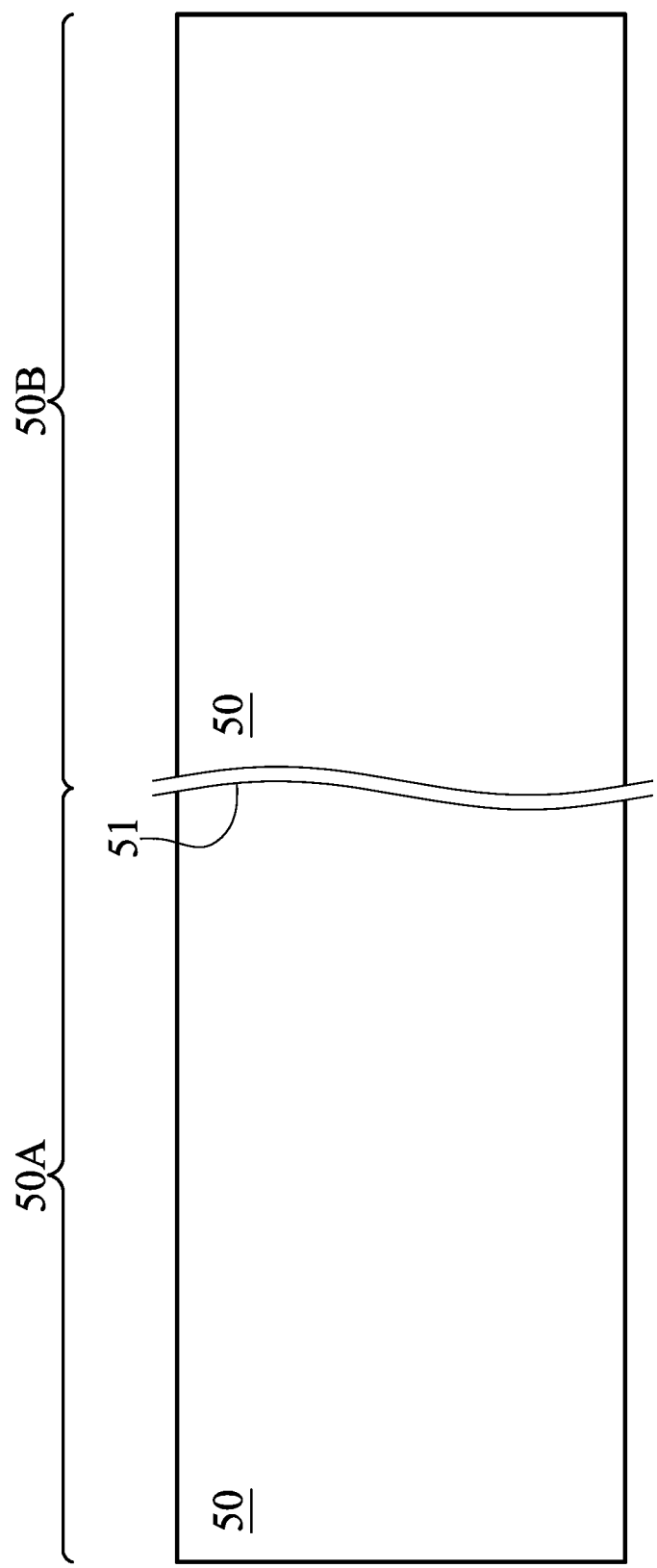
FIG. 2 illustrates a cross-sectional view of a semiconductor substrate in accordance with some embodiments.

In FIG. 2, a substrate 50 is provided. The substrate 50 may be a semiconductor substrate, such as a bulk semiconductor, a semiconductor-on-insulator (SOI) substrate, or the like, which may be doped (e.g., with a p-type dopant or an n-type dopant) or undoped. The substrate 50 may be a wafer, such as a silicon wafer. Generally, an SOI substrate is a layer of a semiconductor material formed on an insulator layer. The insulator layer may be, for example, a buried oxide (BOX) layer, a silicon oxide layer, or the like. The insulator layer is provided on a substrate which is typically a silicon or glass substrate. Other substrates, such as a multi-layered or gradient substrate may also be used. In some embodiments, the semiconductor material of the substrate 50 may include silicon; germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof.

The substrate 50 has a first region 50A and a second region 50B. The first region 50A can be for forming n-type devices, such as NMOS transistors, e.g., n-type FinFETs. The second region 50B can be for forming p-type devices, such as PMOS transistors, e.g., p-type FinFETs. The first region 50A may be physically separated from the second region 50B (as illustrated by divider 51), and any number of device features (e.g., other active devices, doped regions, isolation structures, etc.) may be disposed between the first region 50A and the second region 50B. In some embodiments, both the first region 50A and the second region 50B are used to form the same type of devices, such as both regions being for n-type devices or p-type devices.

Figure 3:
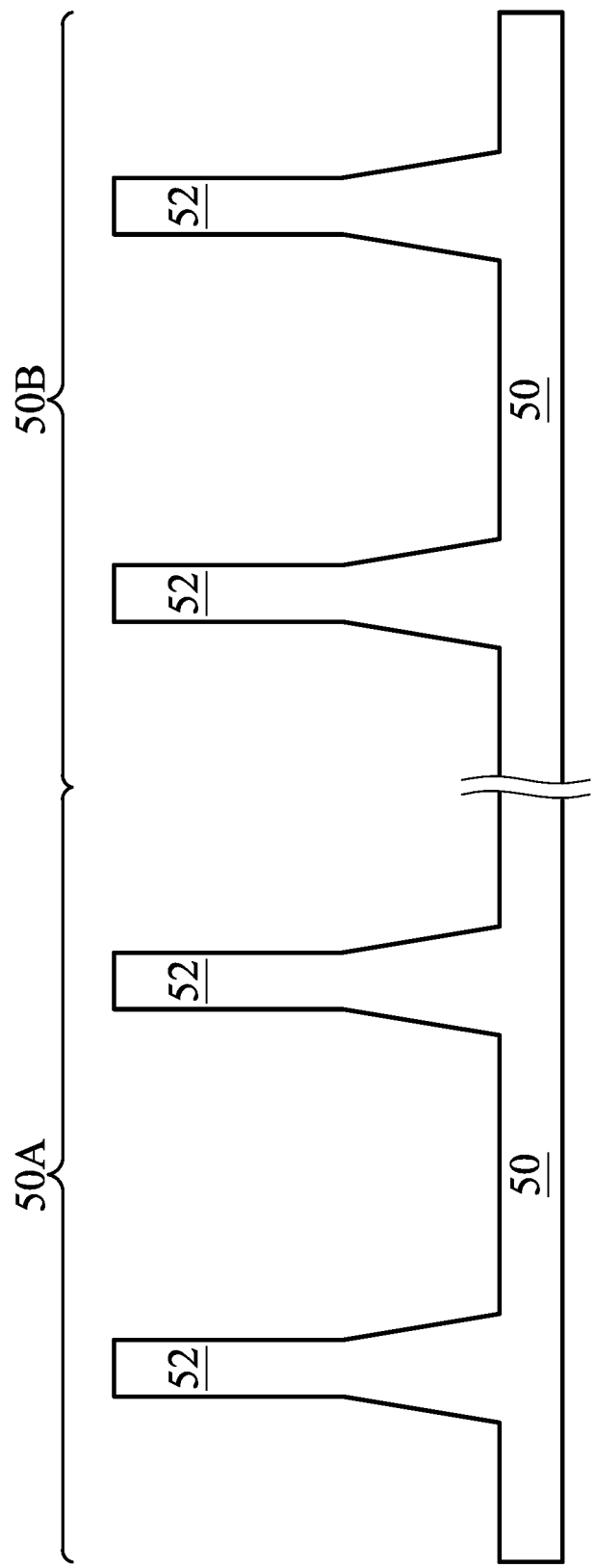
FIG. 3 illustrates a cross-sectional view of a formation of trenches in accordance with some embodiments.

In FIG. 3, fins 52 are formed in the substrate 50. The fins 52 are semiconductor strips. In some embodiments, the fins 52 may be formed in the substrate 50 by etching trenches in the substrate 50. The etching may be one or more of any acceptable etch process, such as a reactive ion etch (RIE), neutral beam etch (NBE), the like, or a combination thereof. The etching may be anisotropic. Please note, although the fins 52 are illustrated as having linear edges, the fins 52 may be rounded or have any other suitable shape. The fins 52 may have a fin-to-fin spacing of between about 12 nm and about 80 nm, such as about 20 nm. In some embodiments, some of the fins 52 may have narrow fin-to-fin spacing and others of the fins 52 may have wide fin-to-fin spacing. For example, the narrow-fin-to-fin spacing may be between about 12 nm and about 40 nm, such as about 28 nm and the wide fin-to-fin spacing may be between about 24 nm and about 80 nm, such as about 56 nm.

Figure 4:
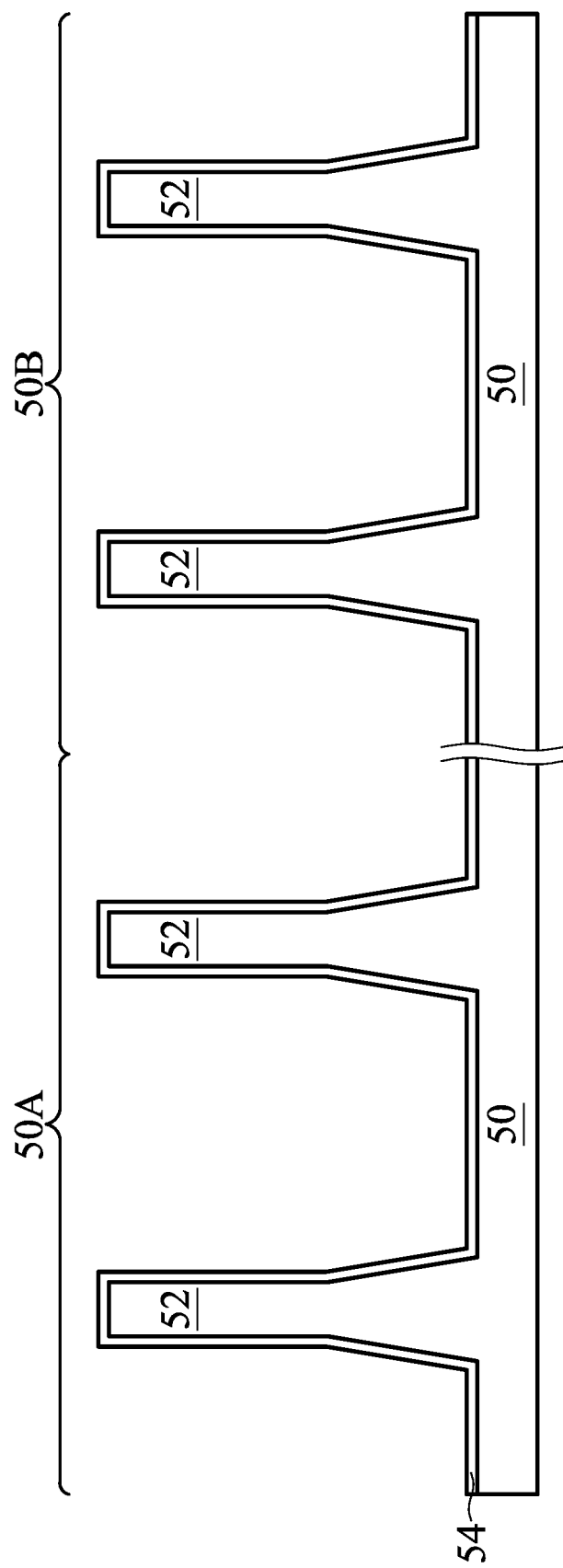
FIG. 4 illustrates a cross-sectional view of a formation of a liner in accordance with some embodiments.

In FIG. 4, a first liner 54 is formed over the substrate 50 and over the fins 52. The first liner 54 may be an oxide, such as silicon oxide ($SiO_2$), a nitride, such as silicon nitride (SiN), the like, or a combination thereof. The first liner 54 may be formed by a conformal process, such as chemical vapor deposition (CVD), atomic layer deposition (ALD), the like, or a combination thereof. In other embodiments, the first liner 54 may be a thermal oxide formed through a thermal oxidation of a surface layer of substrate 50, although other suitable methods may also be used to form the first liner 54. The first liner 54 may have a thickness of between about 1 nm and about 4 nm, such as about 2.5 nm.

Figure 5:
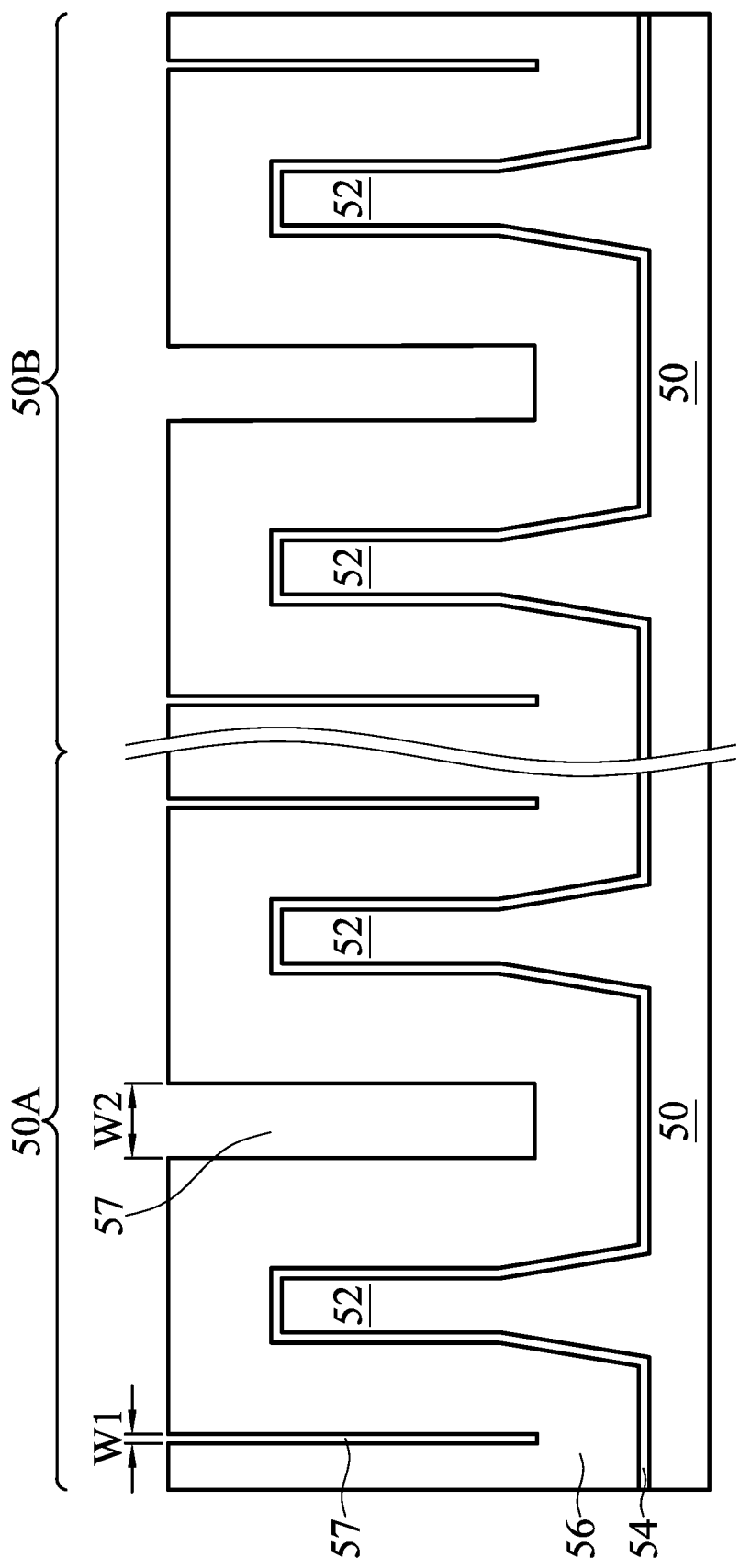
FIG. 5 illustrates a cross-sectional view of a formation of a shallow trench isolation material in accordance with some embodiments.

In FIG. 5, a first shallow trench isolation (STI) material 56 is formed over the first liner 54. The STI material 56 may be an oxide, such as silicon oxide ($SiO_2$), a nitride, such as silicon nitride (SiN), the like, or a combination thereof. The first STI material 56 may be formed of the same or a different material from the first liner 54. In some embodiments, the first STI material 56 may be formed of a material having a different etch selectivity from the first liner 54, and, in other embodiments, the first STI material 56 may be formed of a material having the same etch selectivity as the first liner 54. The first STI material 56 may be formed by a conformal process, such as CVD, ALD, the like, or a combination thereof, although other suitable methods may also be used to form the first STI material 56. The first STI material 56 may have a thickness of between about 6 nm and about 20 nm, such as about 10 nm.

As illustrated in FIG. 5, seams or voids 57 may be formed between the STI material 56 formed over adjacent fins 52. The seams 57 may have varying widths, depending on the spacing of the fins 52. For example, the seams 57 formed between the fins 52 having the narrow fin-to-fin spacing may have a first width W1 and the seams 57 formed between the fins 52 having the wide fin-to-fin spacing may have a second width W2. The first width W1 may be between about 0.5 nm and about 3 nm, such as about 1 nm. The second width W2 may be between about 4 nm and about 20 nm, such as about 14 nm.

Figure 6:
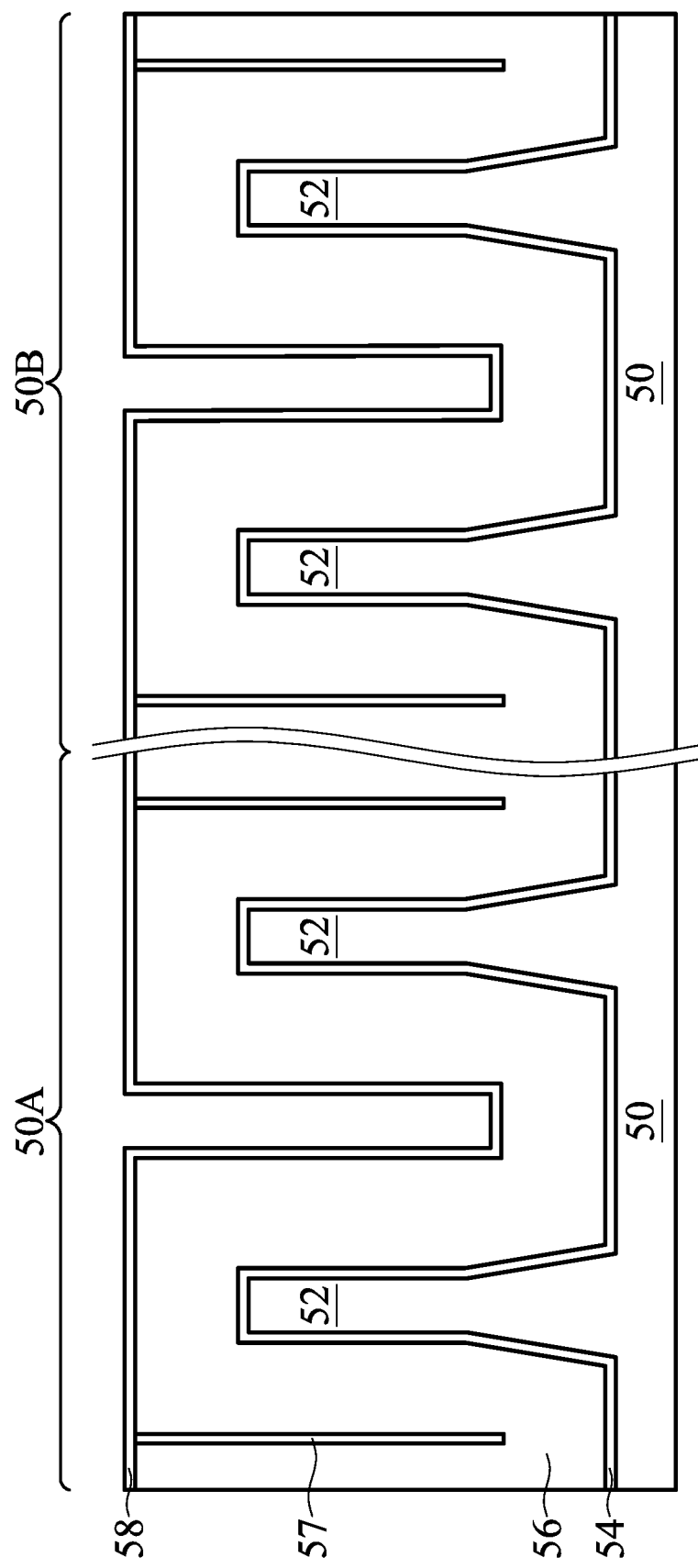
FIG. 6 illustrates a cross-sectional view of a formation of a liner in accordance with some embodiments.

In FIG. 6, a second liner 58 is formed over the first STI material 56 and in the seams 57. The second liner 58 may be an oxide, such as silicon oxide ($SiO_2$), a nitride, such as silicon nitride (SiN), the like, or a combination thereof. In some embodiments, the second liner 58 may be formed of a material having a different etch selectivity from the first liner 54 and/or the first STI material 56, and, in other embodiments, the second liner 58 may be formed of a material having the same etch selectivity as the first liner 54 and/or the first STI material 56. The second liner 58 may be formed by a conformal process, such as CVD, ALD, the like, or a combination thereof, although other suitable methods may also be used to form the second liner 58. The second liner 58 may have a thickness of between about 1 nm and about 4 nm, such as about 2.5 nm.

Figure 7:
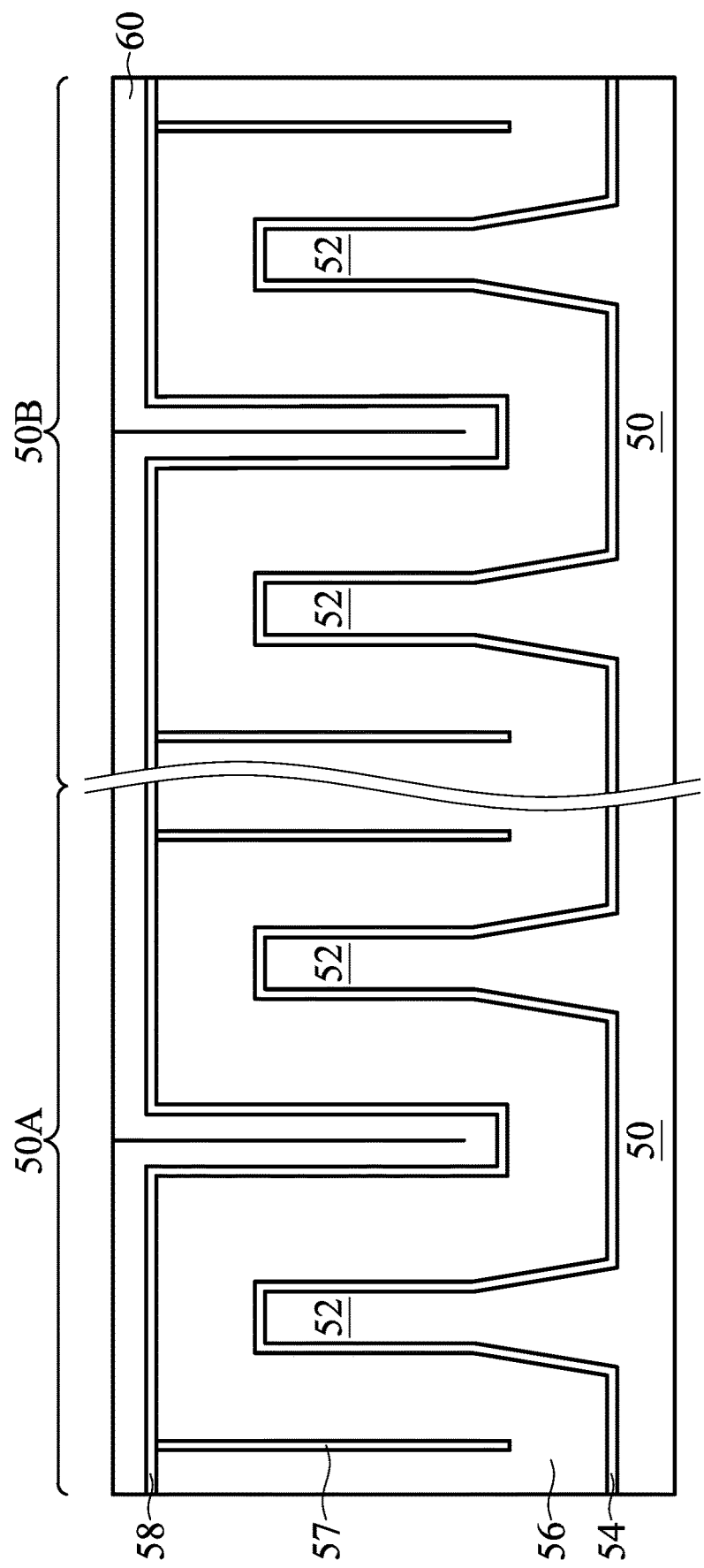
FIG. 7 illustrates a cross-sectional view of a formation of a dummy fin material in accordance with some embodiments.

In FIG. 7, a dummy fin material 60 is formed over the second liner 58. In some embodiments, the dummy fin material 60 may be formed of a dielectric material. The dummy fin material 60 may be silicon carbon nitride (SiCN), hafnium oxide ($HfO_2$), SiOC, SiOCN, multiple layers thereof, or the like. The dummy fin material 60 may be formed by a conformal process, such as CVD, ALD, the like, or a combination thereof, although other suitable methods may also be used to form the dummy fin material 60. The dummy fin material 60 may have a thickness of between about 2 nm and about 10 nm, such as about 7 nm.

Figure 8:
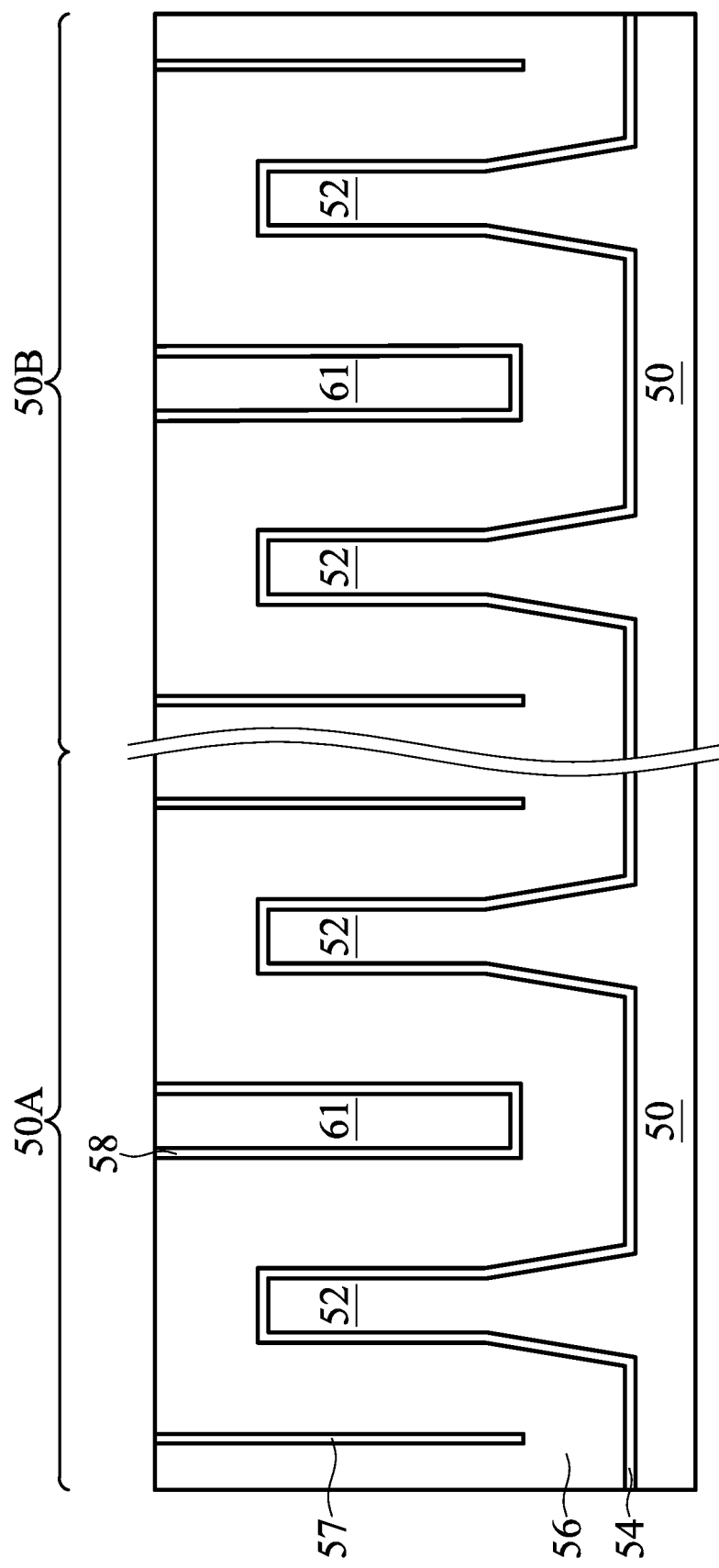
FIG. 8 illustrates a cross-sectional view of a planarization of dummy fins and the liner in accordance with some embodiments.

In FIG. 8, the dummy fin material 60 may be planarized by a planarization process to form dummy fins 61. In some embodiments, the planarization process includes a chemical mechanical polish (CMP), an etch-back process, combinations thereof, or the like. The planarization process may also remove portions of the second liner 58 and the first STI material 56, such that top surfaces of the dummy fin 61, the second liner 58, and the first STI material 56 are co-planar.

The dummy fins 61 may be formed in the seams 57 having a width greater than about 4 nm, such as the seams 57 having the second width W2. The dummy fin 61 may prevent issues caused by large trenches formed between the fins 52 having fin-to-fin spacing of greater than about 12 nm. For example, the dummy fins 61 may reduce topography issues, CMP nonconformity issues, and the like caused by large trenches formed between the fins 52. The dummy fins 61 may be formed of a material having similar planarization properties as the fins 52 (e.g., planarization rate) and may be formed of a dielectric material in order to provide a uniform structure while maintaining an isolation function between the fins 52.

Figure 9:
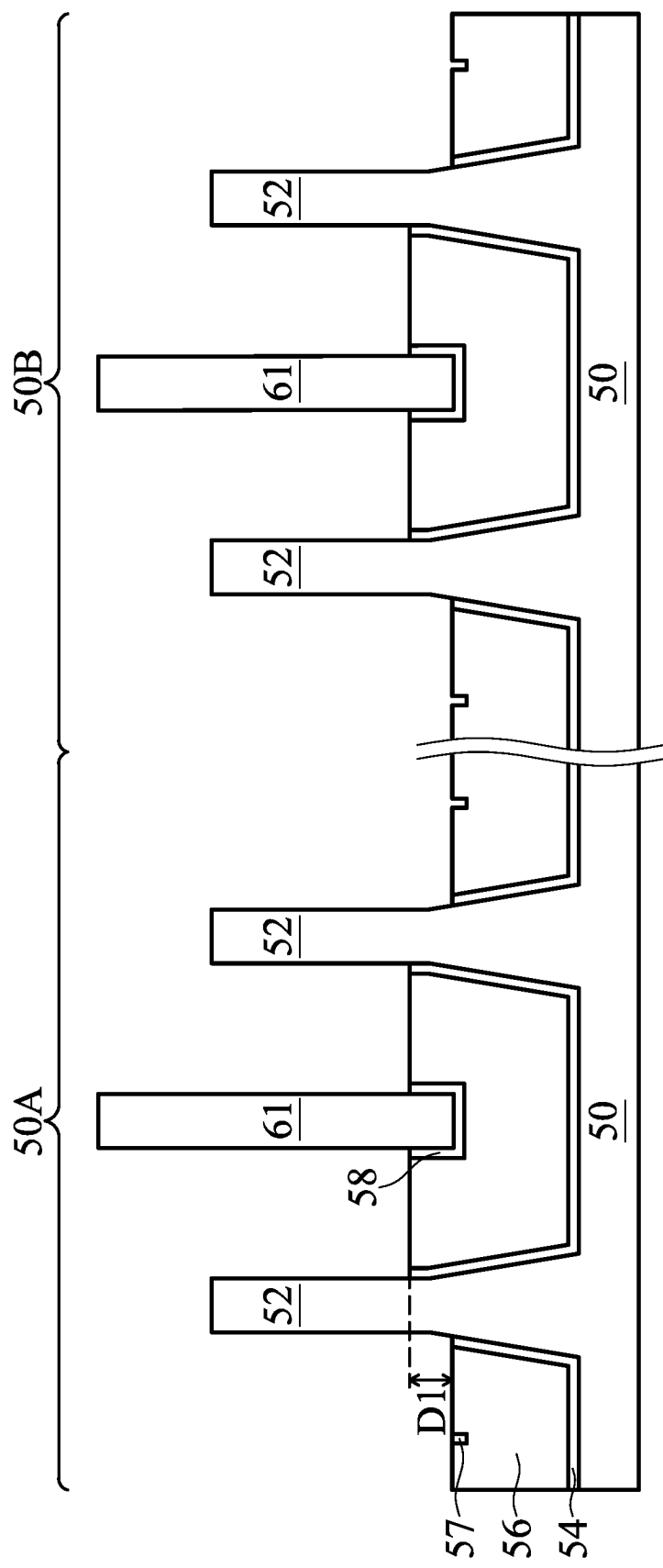
FIG. 9 illustrates a cross-sectional view of a formation of recesses in accordance with some embodiments.

In FIG. 9, the first liner 54, the first STI material 56, and the second liner 58 are etched to form recesses adjacent the fins 52 and the dummy fins 61. The first liner 54, the first STI material 56, and the second liner 58 may be etched using any acceptable etching process, such as a wet etch process, a dry etch process, or the like. In some embodiments, the etching process is selective to the first liner 54, the first STI material 56, and the second liner 58. More specifically, the first liner 54, the first STI material 56, and the second liner 58 may be etched by the selective etch process, while the fins 52 and the dummy fins 61 are not etched by the selective etch process. As such, the fins 52 and the dummy fins 61 may protrude above the first liner 54, the first STI material 56, and the second liner 58, as illustrated in FIG. 9. In some embodiments, a plasma-less gaseous etching process (e.g., an etching process using hydrogen fluoride (HF) gas, ammonia ($NH_3$) gas, combinations thereof, or the like), a remote plasma assisted dry etch process (e.g., a process using hydrogen ($H_2$), nitrogen trifluoride ($NF_3$), ammonia ($NH_3$) by-products, combinations thereof, or the like), a wet etch process (e.g., dilute hydrofluoric (dHF) acid, or the like), or the like may be used to etch the first liner 54, the first STI material 56, and the second liner 58.

As illustrated in FIG. 9, the first liner 54, the first STI material 56, and the second liner 58 may have different etch rates in different areas over the substrate 50. For example, the first liner 54 and the first STI material 56 may be etched more quickly in areas adjacent the unfilled seam 57 and the first liner 54, the first STI material 56, and the second liner 58 may be etched more slowly in areas adjacent the filled seam 57 including the dummy fins 61. The difference in etch rates in these two areas may result in a height difference D1 between top surfaces of the first liner 54 and the first STI material 56 in the areas adjacent the unfilled seam 57 and top surfaces of the first liner 54, the first STI material 56, and the second liner 58 in the areas adjacent the filled seam 57. The height difference D1 may be between about 2 nm and about 20 nm, such as about 10 nm.

Any of the first liner 54, the first STI material 56, and the second liner 58 may be formed of the same materials, or different materials. In some embodiments, the materials of any of the first liner 54, the first STI material 56, and the second liner 58 may be formed of compounds including the same elements in different atomic ratios. The etch rates of the first liner 54, the first STI material 56, the second liner 58 are dependent on the composition of the material in each of the first liner 54, the first STI material 56, the second liner 58, and the materials selected for the first liner 54, the first STI material 56, the second liner 58 may contribute to the height difference D1. More specifically, the height difference D1 may be caused at least in part by the first liner 54 and the second liner 58 being formed of materials having different etch rates.

The height difference D1 may be further caused by the unfilled seams 57 speeding up the rate of etching in the areas adjacent the unfilled seams 57. The height difference D1 results in recess depth loading (also referred to as fin height loading or fin depth loading), which causes performance variation as well as defects in completed devices.

In some embodiments, top surfaces of the first liner 54 and the first STI material 56 may be coplanar in areas adjacent the unfilled seams 57 and top surfaces of the first liner 54, the first STI material 56, and the second liner 58 may be coplanar in areas adjacent the filled seams 57. In other embodiments, although not separately illustrated, top surfaces of the first liner 54, the first STI material 56, and the second liner 58 in the areas adjacent the unfilled seams 57 and/or the areas adjacent the filled seams 57 may be non-coplanar. Further, top surfaces of the first liner 54, the first STI material 56, and the second liner 58 may have flat surfaces as illustrated, convex surfaces, concave surfaces (such as dishing), or a combination thereof.

Figure 10:
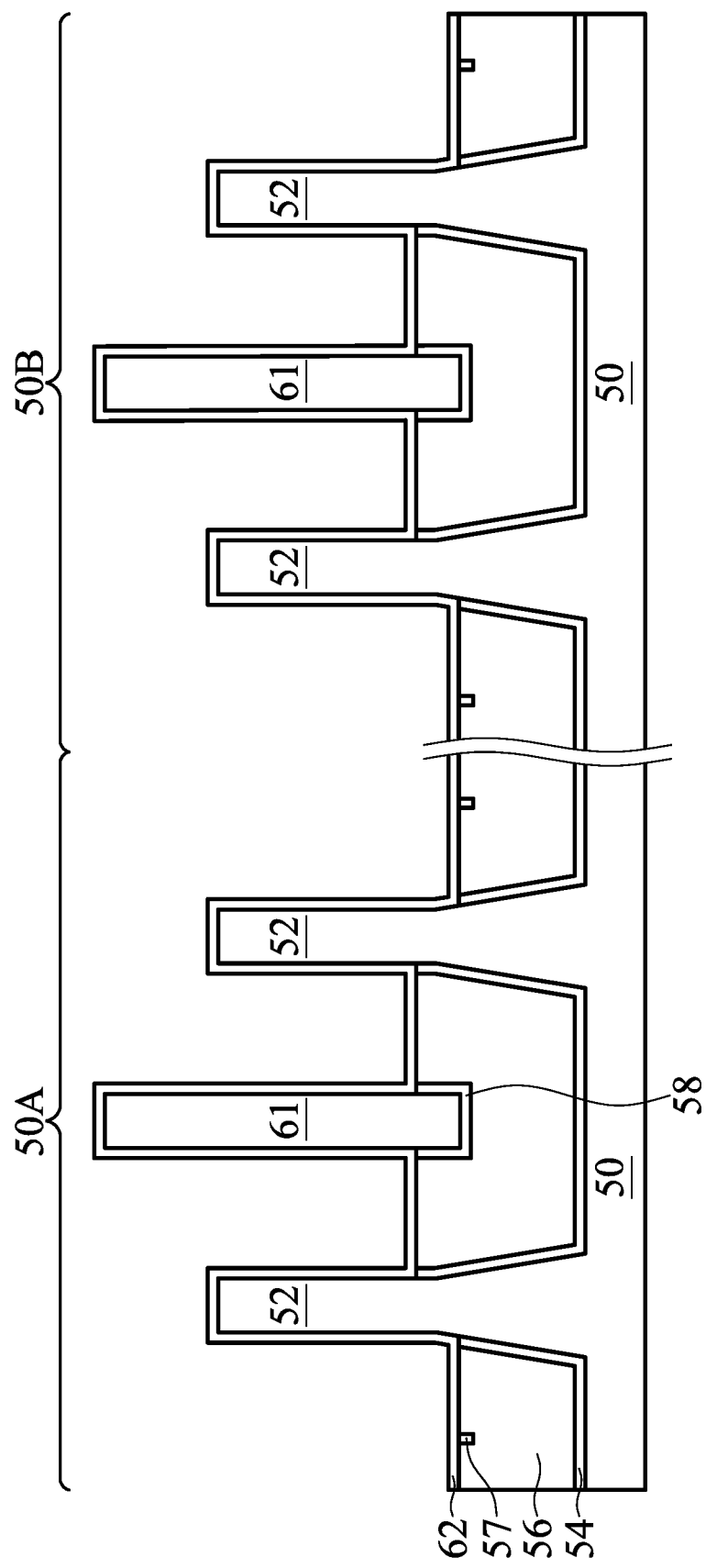
FIG. 10 illustrates a cross-sectional view of a formation of a liner in accordance with some embodiments.

In FIG. 10, a third liner 62 is formed over the first liner 54, the first STI material 56, the second liner 58, the seams 57, the fins 52, and the dummy fins 61. The third liner 62 may be an oxide, such as silicon oxide ($SiO_2$), a nitride, such as silicon nitride (SiN), the like, or a combination thereof. The third liner 62 may be formed by a conformal process, such as CVD, ALD, the like, or a combination thereof, although other suitable methods may also be used to form the third liner 62. The third liner 62 may have a thickness of between about 1 nm and about 4 nm, such as about 2.5 nm.

Figure 11:
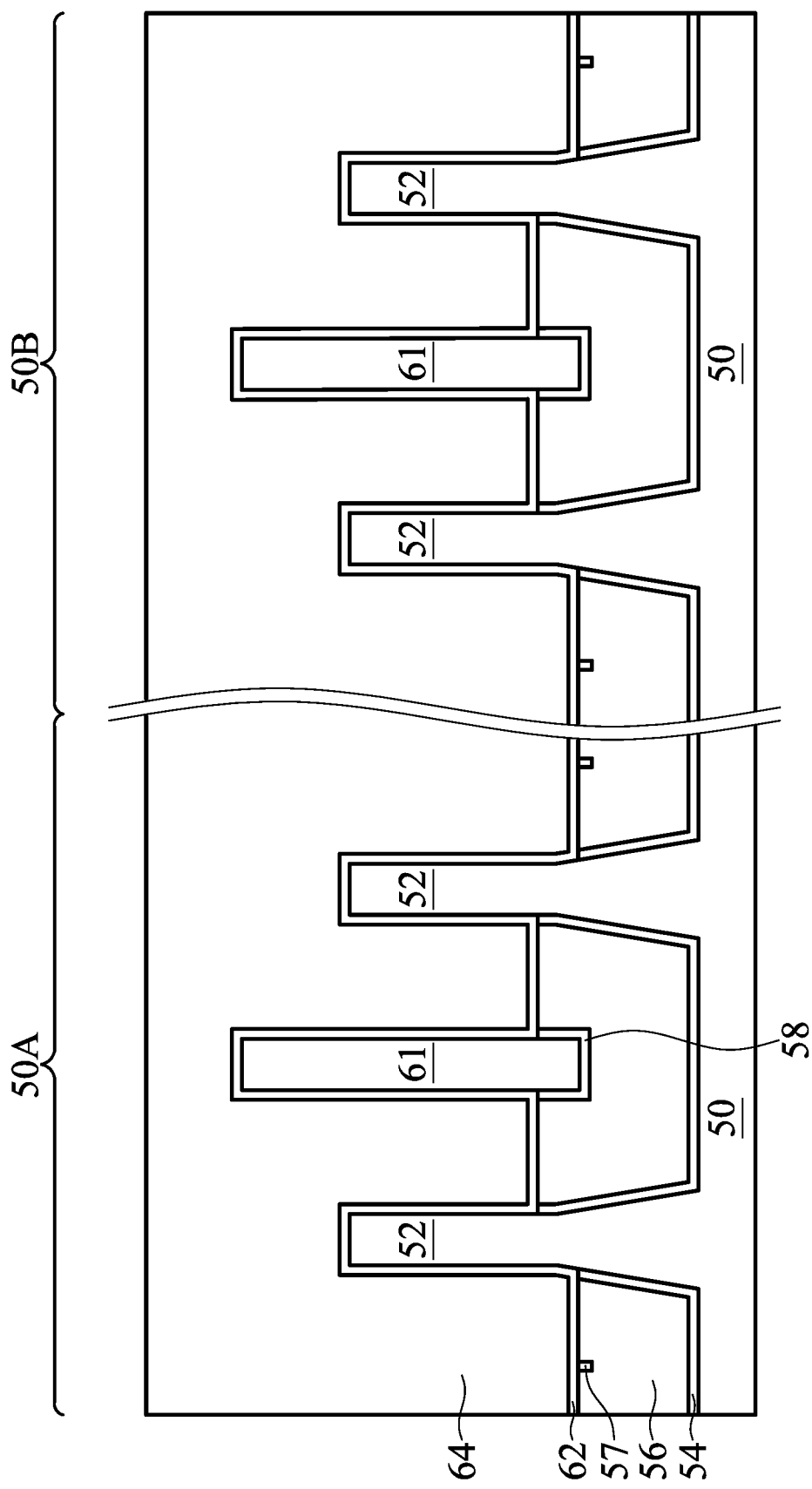
FIG. 11 illustrates a cross-sectional view of a formation of a shallow trench isolation material in accordance with some embodiments.

In FIG. 11, a second STI material 64 is formed over the third liner 62. The second STI material 64 may be an oxide, such as silicon oxide ($SiO_2$), a nitride, such as silicon nitride (SiN), the like, or a combination thereof. The second STI material 64 may be deposited as a flowable material (e.g., a liquid material) over the third liner 62 and may fill the recesses adjacent to the fins 52 and the dummy fins 61. As illustrated in FIG. 11, the second STI material 64 may be deposited such that the second STI material 64 extends above top surfaces of the fins 52 and the dummy fins 61. After the second STI material 64 is deposited, the second STI material 64 may be cured and/or annealed to form a solid material. The second STI material 64 may be annealed at a temperature of between about 200° C. and about 1100° C., such as about 750° C. for a time of between about 20 minutes and about 7 hours, such as about 2 hours. The second STI material 64 may be cured using a process such as UV curing, curing in a vapor chamber, or the like. In embodiments in which the second STI material 64 is cured by UV curing, the second STI material 64 may be cured at a temperature of between about 0° C. and about 50° C. for a period of between about 10 seconds and about 300 seconds. Ozone ($O_3$) may optionally be flowed during the UV curing at a pressure of between about 5 Torr and about 760 Torr. In still further embodiments, the second STI material 64 may be cured in an $H_2O$ vapor chamber at a temperature of between about 10° C. and about 170° C. for a period of between about 10 seconds and about 1,000 seconds. Ozone or oxygen ($O_2$) may optionally be flowed during the vapor chamber curing at a pressure of between about 100 Torr and about 760 Torr. Higher temperatures used for the annealing or curing may correspond to a shorter anneal time/cure time and lower temperatures may correspond to a longer anneal time/cure time. Because the second STI material 64 is deposited as a flowable material, rather than by a conformal process, the second STI material 64 may be deposited without seams or voids formed therein.

Figure 12:
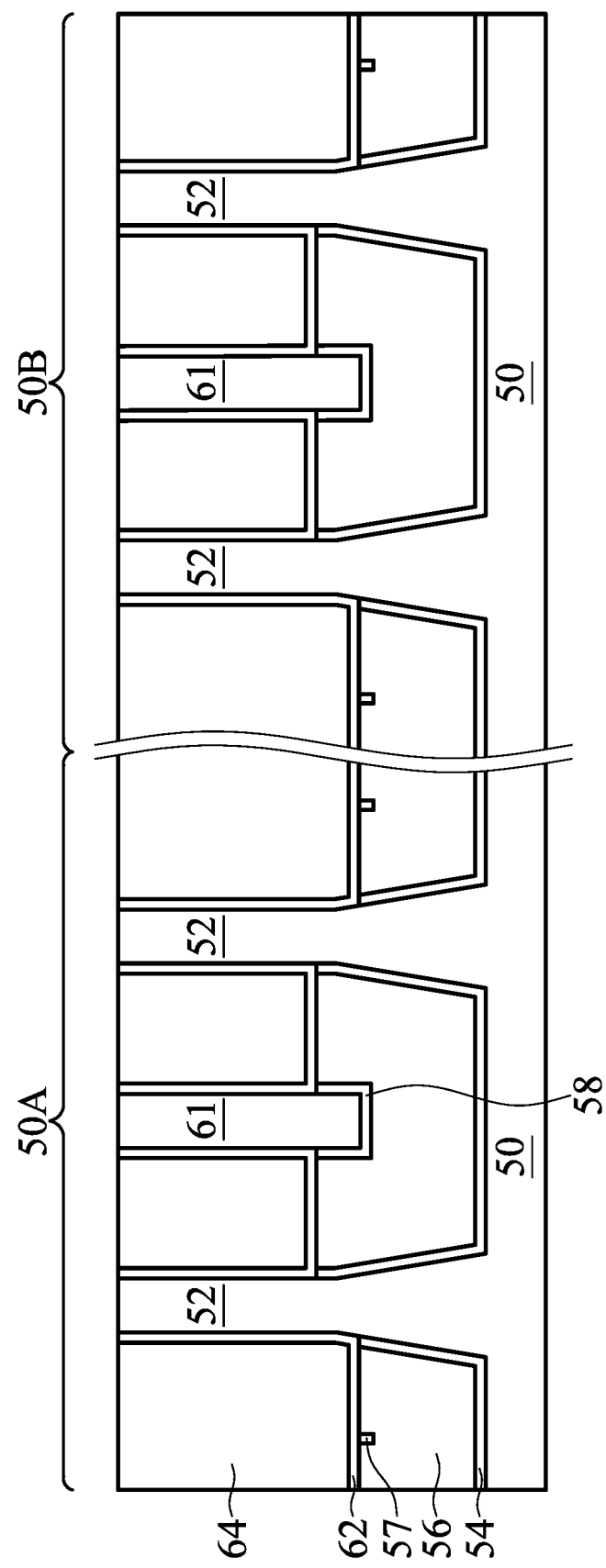
FIG. 12 illustrates a cross-sectional view of a planarization of dummy fins and the shallow trench isolation material in accordance with some embodiments.

In FIG. 12, the second STI material 64, the third liner 62, the dummy fins 61, and the fins 52 are planarized by a planarization process. In some embodiments, the planarization process includes a chemical mechanical polish (CMP), an etch-back process, combinations thereof, or the like. As illustrated in FIG. 12, following the planarization process, top surfaces of the second STI material 64, the third liner 62, the dummy fins 61, and the fins 52 may be co-planar with each other.

Figure 13:
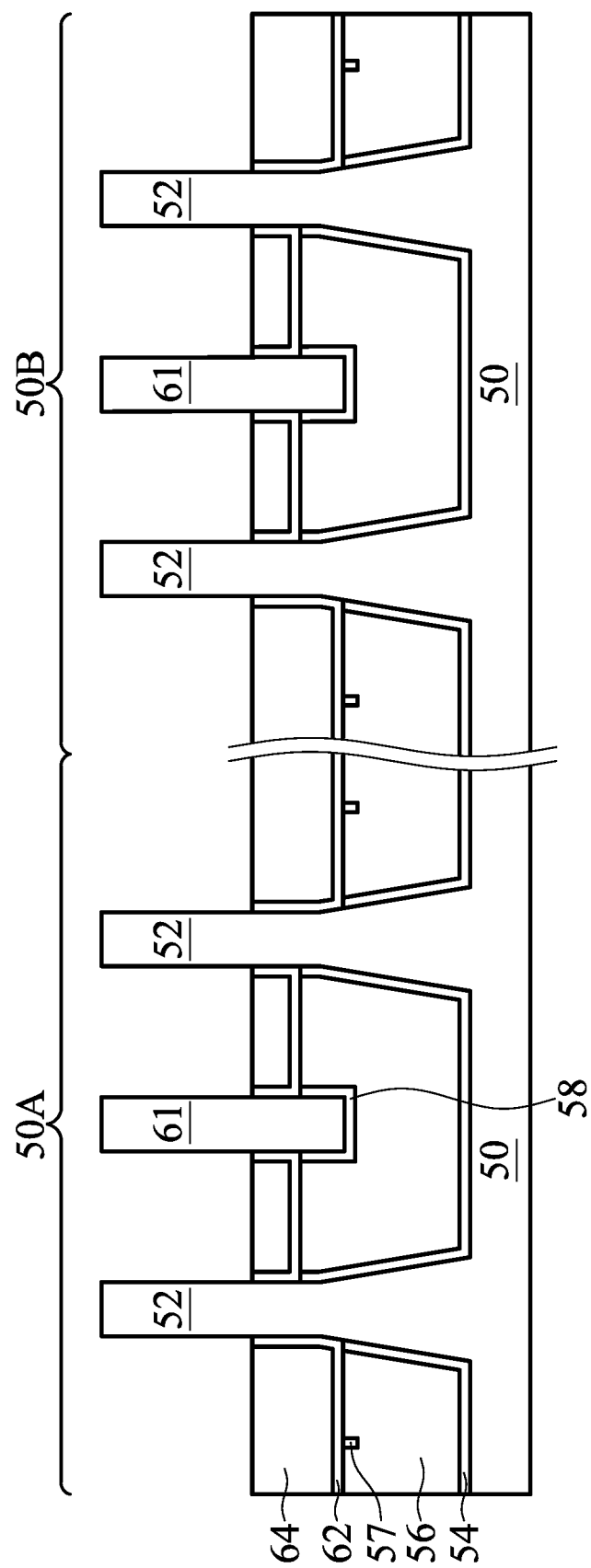
FIG. 13 illustrates a cross-sectional view of a formation of recesses in accordance with some embodiments.

In FIG. 13, the second STI material 64 and the third liner 62 are etched to form recesses adjacent the fins 52 and the dummy fins 61. The second STI material 64 and the third liner 62 may be etched using one or more etch processes. The second STI material 64 and the third liner 62 may be etched using any acceptable etching process, such as a wet etch process, a dry etch process, or the like. In some embodiments, the etching process is selective to the second STI material 64 and the third liner 62. More specifically, the second STI material 64 and the third liner 62 may be etched by the selective etch process, while the fins 52 and the dummy fins 61 are not etched by the selective etch process. As such, the fins 52 and the dummy fins 61 may protrude above the second STI material 64 and the third liner 62, as illustrated in FIG. 13. In some embodiments, a plasma-less gaseous etching process (e.g., an etching process using hydrogen fluoride (HF) gas, ammonia ($NH_3$) gas, combinations thereof, or the like), a remote plasma assisted dry etch process (e.g., a process using hydrogen ($H_2$), nitrogen trifluoride ($NF_3$), ammonia ($NH_3$) by-products, combinations thereof, or the like), a wet etch process (e.g., dilute hydrofluoric (dHF) acid, or the like), or the like may be used to etch the second STI material 64 and the third liner 62. The first liner 54, the first STI material 56, the second liner 58, the third liner 62, and the second STI material 64 may be collectively referred to as STI regions.

Because the second STI material 64 and the third liner 62 are formed of the same materials in areas adjacent to the fins 52 and the dummy fins 61 across the substrate 50, and the second STI material 64 is formed without seams or voids formed therein, the second STI material 64 and the third liner 62 are etched at the same rate across the substrate 50. As a result, there is no height difference between top surfaces of the second STI material 64 and the third liner 62 in different areas over the substrate 50. Accordingly, there is no recess depth loading, and performance variations and defects in the resulting devices are reduced.

Figure 14:
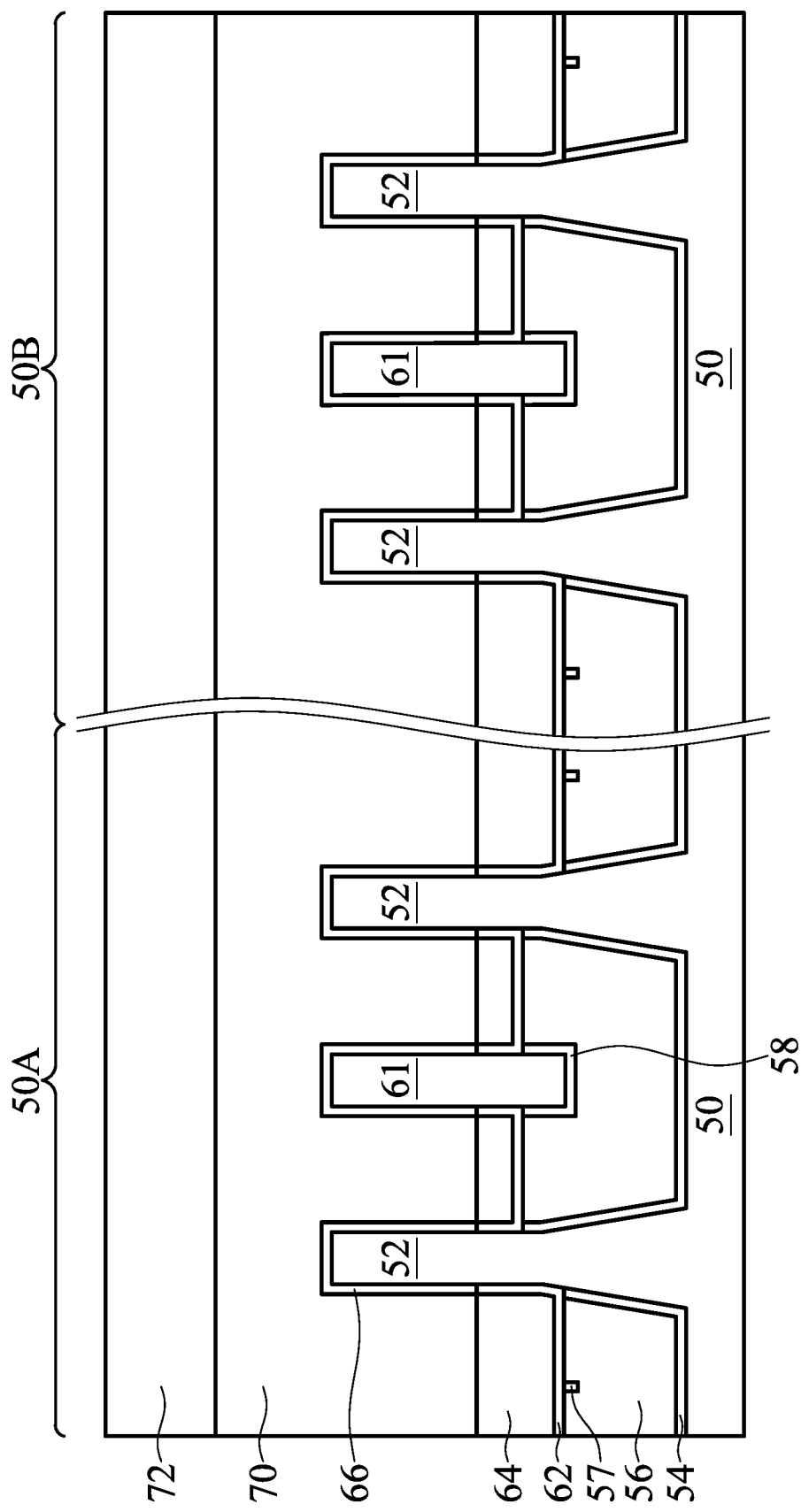
FIG. 14 illustrates a cross-sectional view of a formation of a dummy dielectric layer and a dummy gate layer in accordance with some embodiments.

In FIG. 14, a dummy dielectric layer 66 is formed on the fins 52 and the dummy fins 61. The dummy dielectric layer 66 may be, for example, silicon oxide, silicon nitride, a combination thereof, or the like, and may be deposited or thermally grown according to acceptable techniques. A dummy gate layer 70 is formed over the dummy dielectric layer 66, and a mask layer 72 is formed over the dummy gate layer 70. The dummy gate layer 70 may be deposited over the dummy dielectric layer 66 and then planarized, such as by a CMP. The mask layer 72 may be deposited over the dummy gate layer 70. The dummy gate layer 70 may be a conductive material and may be selected from a group including polycrystalline-silicon (polysilicon), poly-crystalline silicon-germanium (poly-SiGe), metallic nitrides, metallic silicides, metallic oxides, and metals. In one embodiment, amorphous silicon is deposited and recrystallized to create polysilicon. The dummy gate layer 70 may be deposited by physical vapor deposition (PVD), CVD, sputter deposition, or other techniques known and used in the art for depositing conductive materials. The dummy gate layer 70 may be made of other materials that have a high etching selectivity from the etching of isolation regions. The mask layer 72 may include, for example, SiN, SiON, or the like. In this example, a single dummy gate layer 70 and a single mask layer 72 are formed across the first region 50A and the second region 50B. In some embodiments, separate dummy gate layers may be formed in the first region 50A and the second region 50B, and separate mask layers may be formed in the first region 50A and the second region 50B.

FIGS. 15A through 21B illustrate various additional steps in the manufacturing of embodiment devices. FIGS. 15A through 21B illustrate features in either of the first region 50A and the second region 50B. For example, the structures illustrated in FIGS. 15A through 21B may be applicable to both the first region 50A and the second region 50B.

Differences (if any) in the structures of the first region 50A and the second region 50B are described in the text accompanying each figure.

Figure 15A:
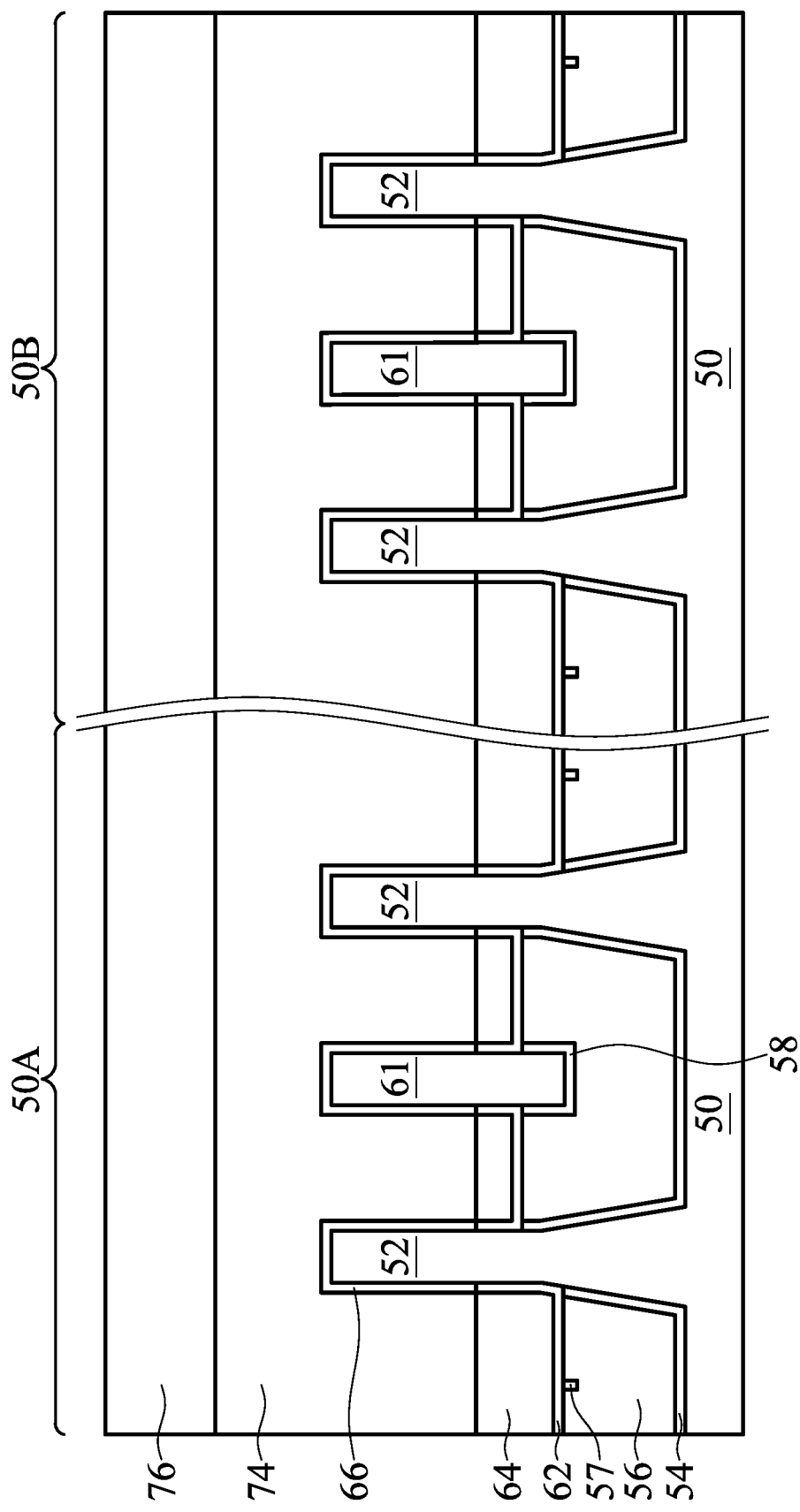
FIGS. 15A and 15B illustrate cross-sectional views of a formation of a mask layer and gate seal spacers in accordance with some embodiments.
Figure 15B:
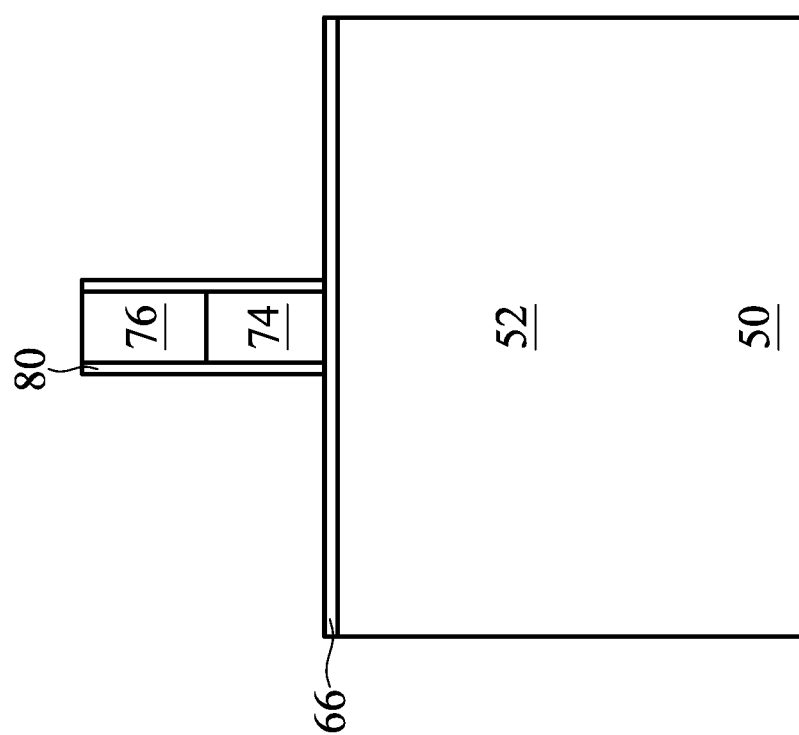

In FIGS. 15A and 15B, the mask layer 72 may be patterned using acceptable photolithography and etching techniques to form masks 76. The pattern of the masks 76 then may be transferred to the dummy gate layer 70 and the dummy dielectric layer 66 by an acceptable etching technique to form dummy gates 74. The dummy gates 74 cover respective channel regions of the fins 52. The pattern of the masks 76 may be used to physically separate each of the dummy gates 74 from adjacent dummy gates. The dummy gates 74 may also have a lengthwise direction substantially perpendicular to the lengthwise direction of respective epitaxial fins 52.

Further in FIGS. 15A and 15B, gate seal spacers 80 can be formed on exposed surfaces of the dummy gates 74, the masks 76, and/or the fins 52. A thermal oxidation or a deposition followed by an anisotropic etch may form the gate seal spacers 80.

After the formation of the gate seal spacers 80, implants for lightly doped source/drain (LDD) regions (not separately illustrated) may be performed. In embodiments including devices of different device types, a mask, such as a photoresist, may be formed over the first region 50A, while exposing the second region 50B, and appropriate type (e.g., n-type or p-type) impurities may be implanted into the exposed fins 52 in the second region 50B. The mask may then be removed. Subsequently, a mask, such as a photoresist, may be formed over the second region 50B while exposing the first region 50A, and appropriate type impurities may be implanted into the exposed fins 52 in the first region 50A. The mask may then be removed. The n-type impurities may be phosphorus, arsenic, or the like and the p-type impurities may be boron, $BF_2$, or the like. The lightly doped source/drain regions may have a concentration of impurities of from about $10^{15}$ cm$^{-3}$ to about $10^{16}$ cm$^{-3}$. An anneal may be used to activate the implanted impurities.

Figure 16A:
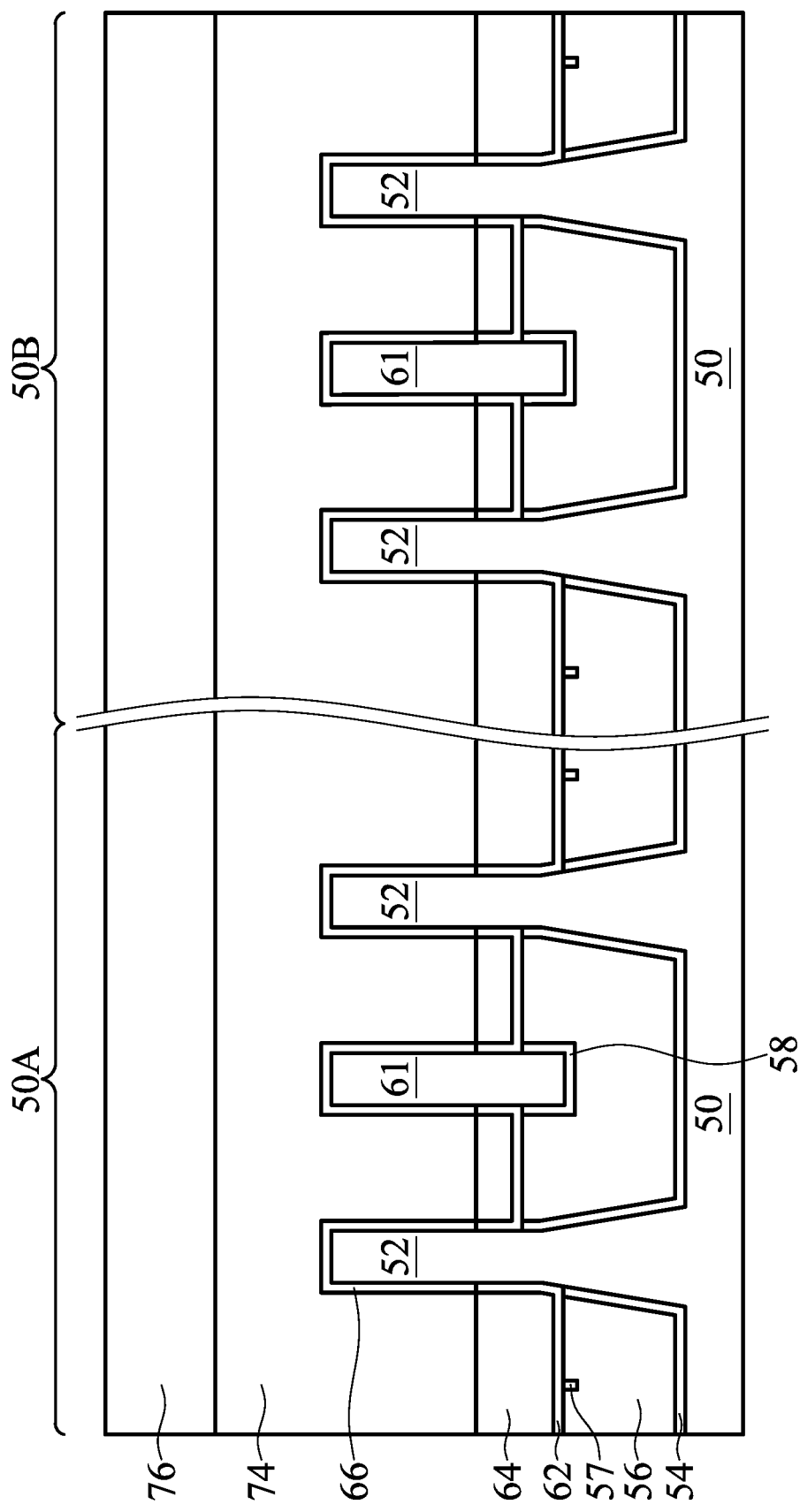
FIGS. 16A and 16B illustrate cross-sectional views of a formation of gate spacers in accordance with some embodiments.
Figure 16B:
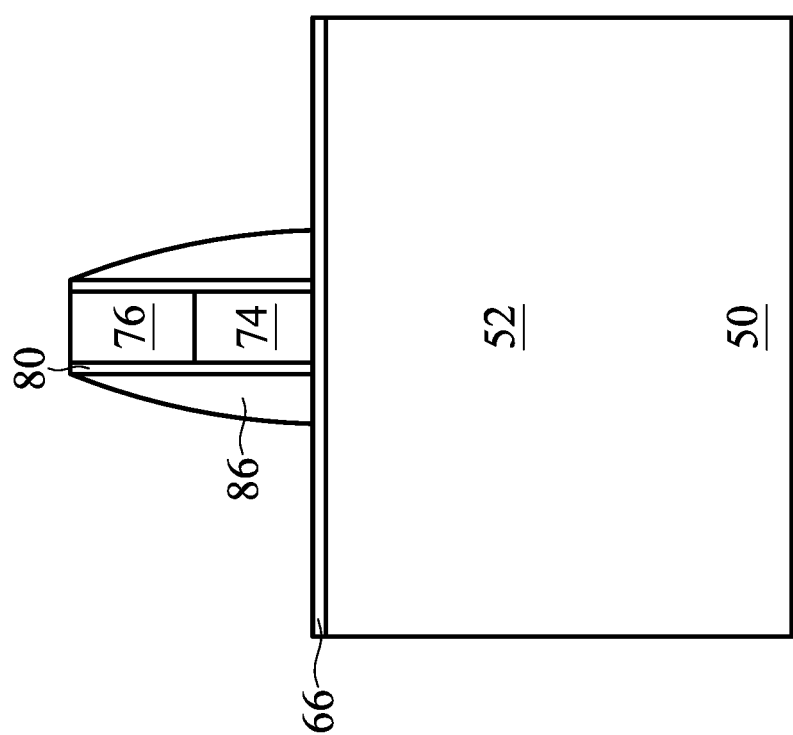

In FIGS. 16A and 16B, gate spacers 86 are formed on the gate seal spacers 80 along sidewalls of the dummy gates 74 and the masks 76. The gate spacers 86 may be formed by conformally depositing a material and subsequently anisotropically etching the material. The material of the gate spacers 86 may be silicon nitride, SiCN, a combination thereof, or the like.

Figure 17A:
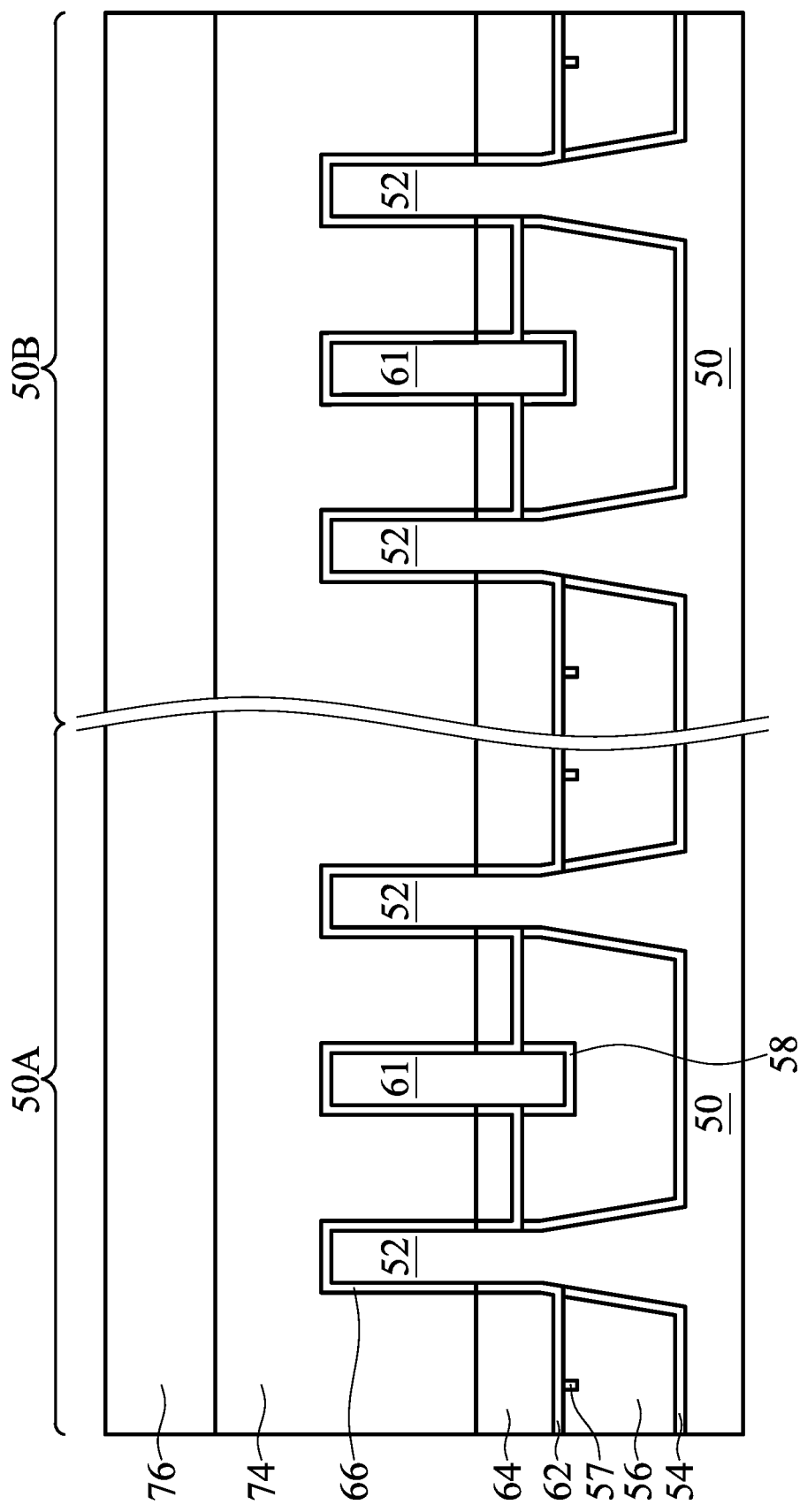
FIGS. 17A-17C illustrate cross-sectional views of a formation of source/drain regions in accordance with some embodiments.
Figure 17B:
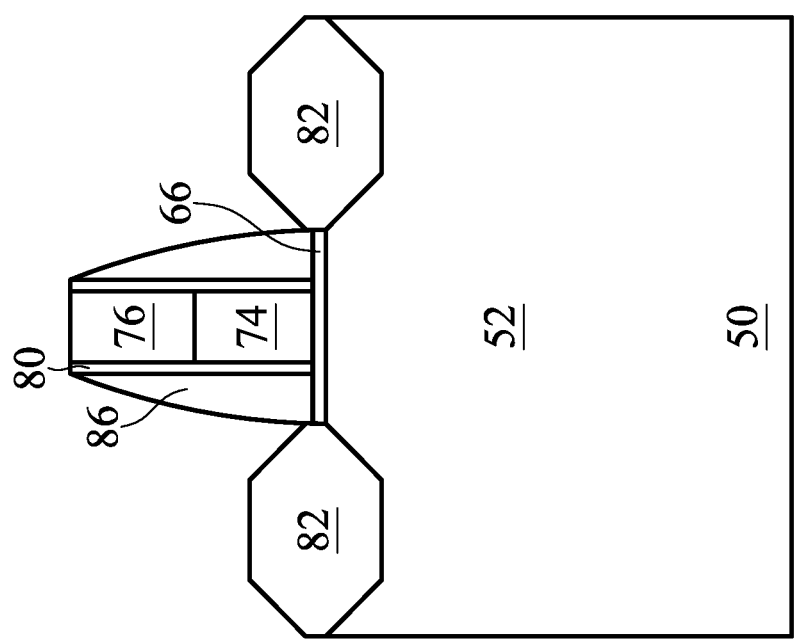

In FIGS. 17A and 17B epitaxial source/drain regions 82 are formed in the fins 52. The epitaxial source/drain regions 82 are formed in the fins 52 such that each dummy gate 74 is disposed between respective neighboring pairs of the epitaxial source/drain regions 82. In some embodiments that epitaxial source/drain regions 82 may extend into the fins 52. In some embodiments, the gate spacers 86 are used to separate the epitaxial source/drain regions 82 from the dummy gates 74 by an appropriate lateral distance so that the epitaxial source/drain regions 82 do not short out subsequently formed gates of the resulting FinFETs.

The epitaxial source/drain regions 82 in the first region 50A, e.g., the NMOS region, may be formed by masking the second region 50B, e.g., the PMOS region, and etching source/drain regions of the fins 52 in the first region 50A to form recesses in the fins 52. Then, the epitaxial source/drain regions 82 in the first region 50A are epitaxially grown in the recesses. The epitaxial source/drain regions 82 may include any acceptable material, such as appropriate for n-type FinFETs. For example, if the fins 52 are silicon, the epitaxial source/drain regions 82 in the first region 50A may include silicon, SiC, SiCP, SiP, or the like. The epitaxial source/drain regions 82 in the first region 50A may have surfaces raised from respective surfaces of the fins 52 and may have facets.

The epitaxial source/drain regions 82 in the second region 50B, e.g., the PMOS region, may be formed by masking the first region 50A, e.g., the NMOS region, and etching source/drain regions of the fins 52 in the second region 50B are etched to form recesses in the fins 52. Then, the epitaxial source/drain regions 82 in the second region 50B are epitaxially grown in the recesses. The epitaxial source/drain regions 82 may include any acceptable material, such as appropriate for p-type FinFETs. For example, if the fins 52 are silicon, the epitaxial source/drain regions 82 in the second region 50B may comprise SiGe, SiGeB, Ge, GeSn, or the like. The epitaxial source/drain regions 82 in the second region 50B may also have surfaces raised from respective surfaces of the fins 52 and may have facets.

The epitaxial source/drain regions 82 and/or the fins 52 may be implanted with dopants to form source/drain regions, similar to the process previously discussed for forming lightly doped source/drain regions, followed by an anneal. The source/drain regions may have an impurity concentration of between about $10^{19}$ cm$^{-3}$ and about $10^{21}$ cm$^{-3}$. The n-type and/or p-type impurities for source/drain regions may be any of the impurities previously discussed. In some embodiments, the epitaxial source/drain regions 82 may be in situ doped during growth.

Figure 17C:
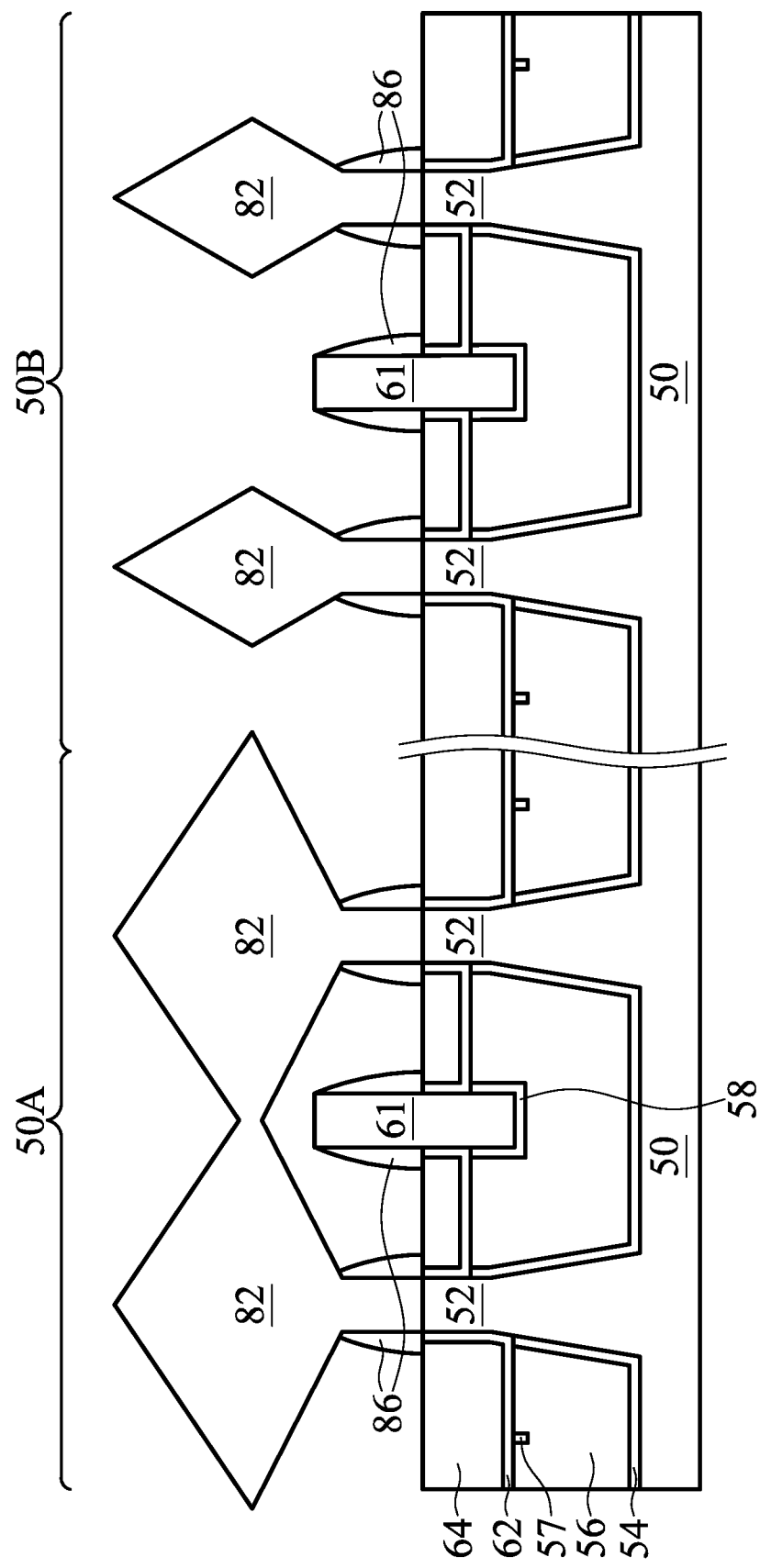

In some embodiments, such as the embodiment illustrated in FIG. 17C, the fins 52 may be selectively etched such that the dummy fins 61 are not etched. As such, the dummy fins 61 may remain after the epitaxial source/drain regions 82 are formed. In various other embodiments, the dummy fins 61 may be etched at the same time as the epitaxial source/drain regions 82. The process used to form the epitaxial source/drain regions 82 may be selective such that the epitaxial source/drain regions 82 may be formed on the fins 52, without being formed on the dummy fins 61.

As a result of the epitaxy processes used to form the epitaxial source/drain regions 82 in the first region 50A and the second region 50B, upper surfaces of the epitaxial source/drain regions have facets which expand laterally outward beyond a sidewalls of the fins 52. In some embodiments, these facets cause adjacent source/drain regions 82 of a same finFET to merge, as illustrated by FIG. 17C in the first region 50A. In other embodiments, adjacent source/drain regions 82 remain separated after the epitaxy process is completed, as illustrated by FIG. 17C in the second region 50B. Although the source/drain regions 82 in the first region 50A are illustrated as being merged and the source/drain regions 82 in the second region 50B are illustrated as being unmerged, this is merely an illustration of one embodiment and the source/drain regions 82 in either region may be merged or unmerged.

Figure 18A:
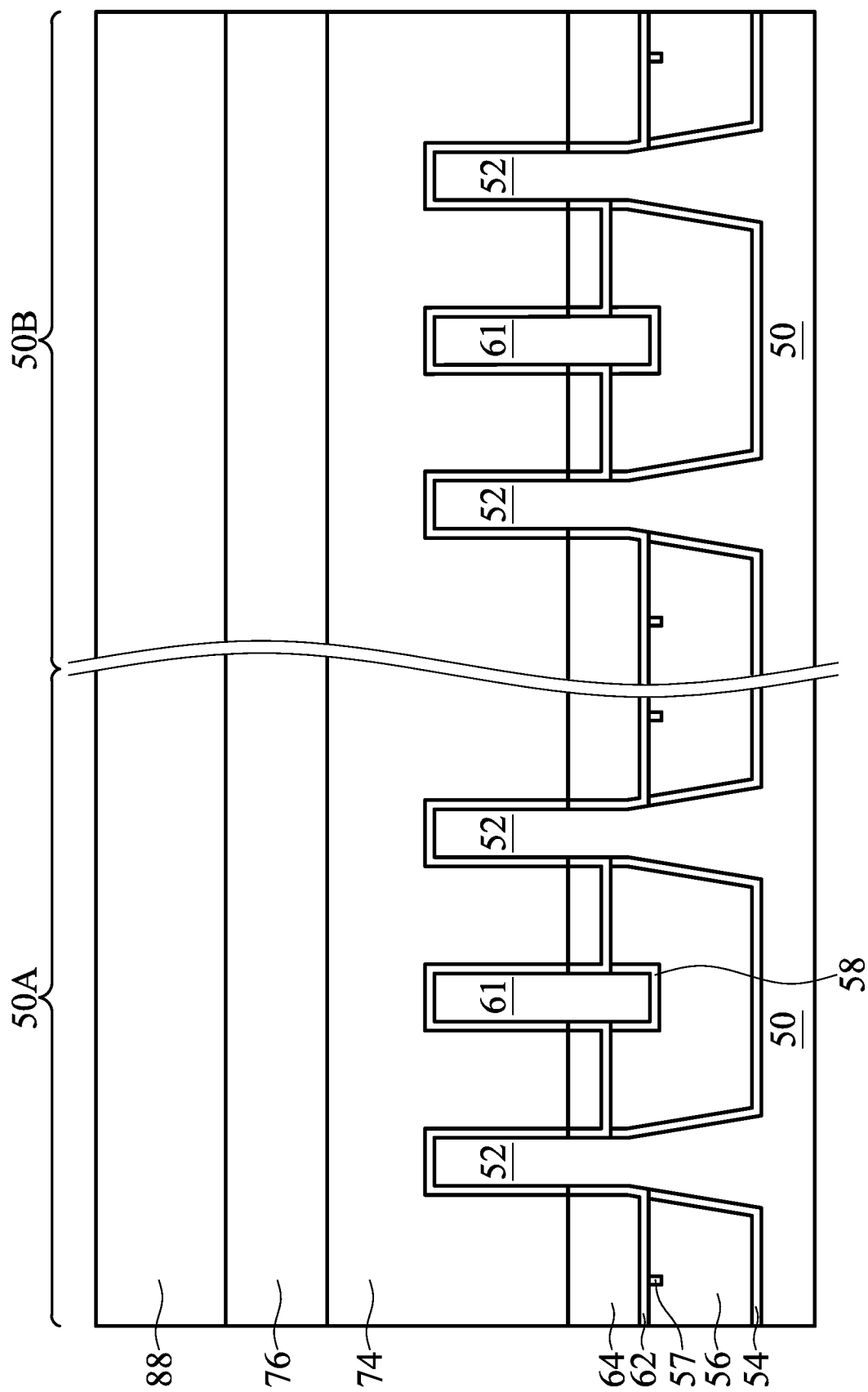
FIGS. 18A and 18B illustrate cross-sectional views of a formation of an inter-layer dielectric layer in accordance with some embodiments.
Figure 18B:
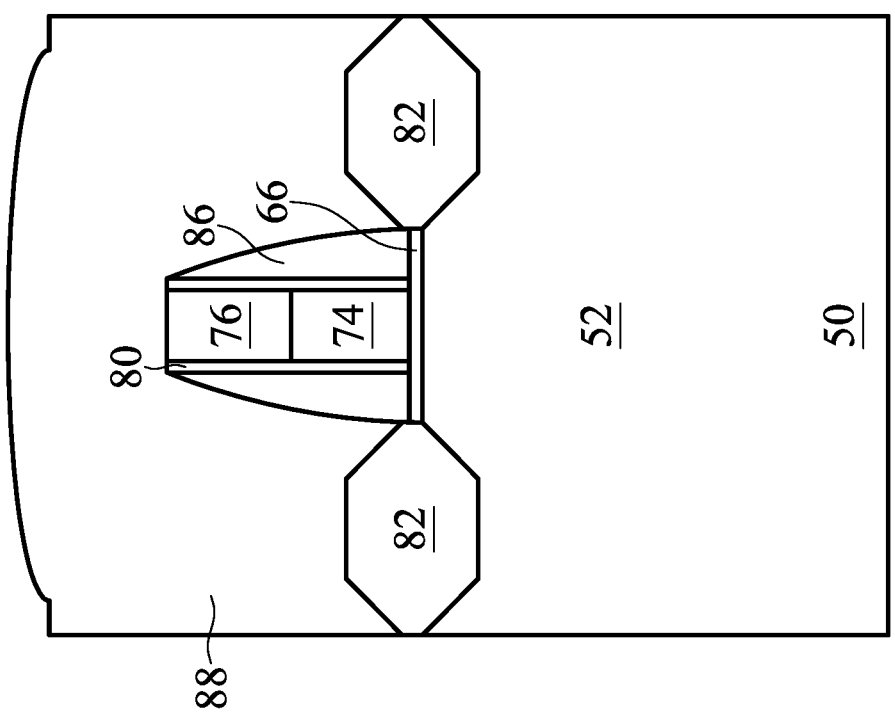

In FIGS. 18A and 18B, an ILD 88 is deposited over the structure illustrated in FIGS. 17A and 17B. The ILD 88 may be formed of a dielectric material or a semiconductor material, and may be deposited by any suitable method, such as CVD, plasma-enhanced CVD (PECVD), or FCVD. Dielectric materials may include phosphosilicate glass (PSG), borosilicate Glass (BSG), boron-doped phosphosilicate glass (BPSG), undoped silicate glass (USG), or the like. Semiconductor materials may include amorphous silicon, silicon germanium ($Si_xGe_{1-x}$, where x can be between approximately 0 and 1), pure germanium, or the like. Other insulation or semiconductor materials formed by any acceptable process may be used. In some embodiments, a contact etch stop layer (CESL) (not separately illustrated) is disposed between the ILD 88 and the epitaxial source/drain regions 82, the hard mask 76, and the gate spacers 86.

Figure 19A:
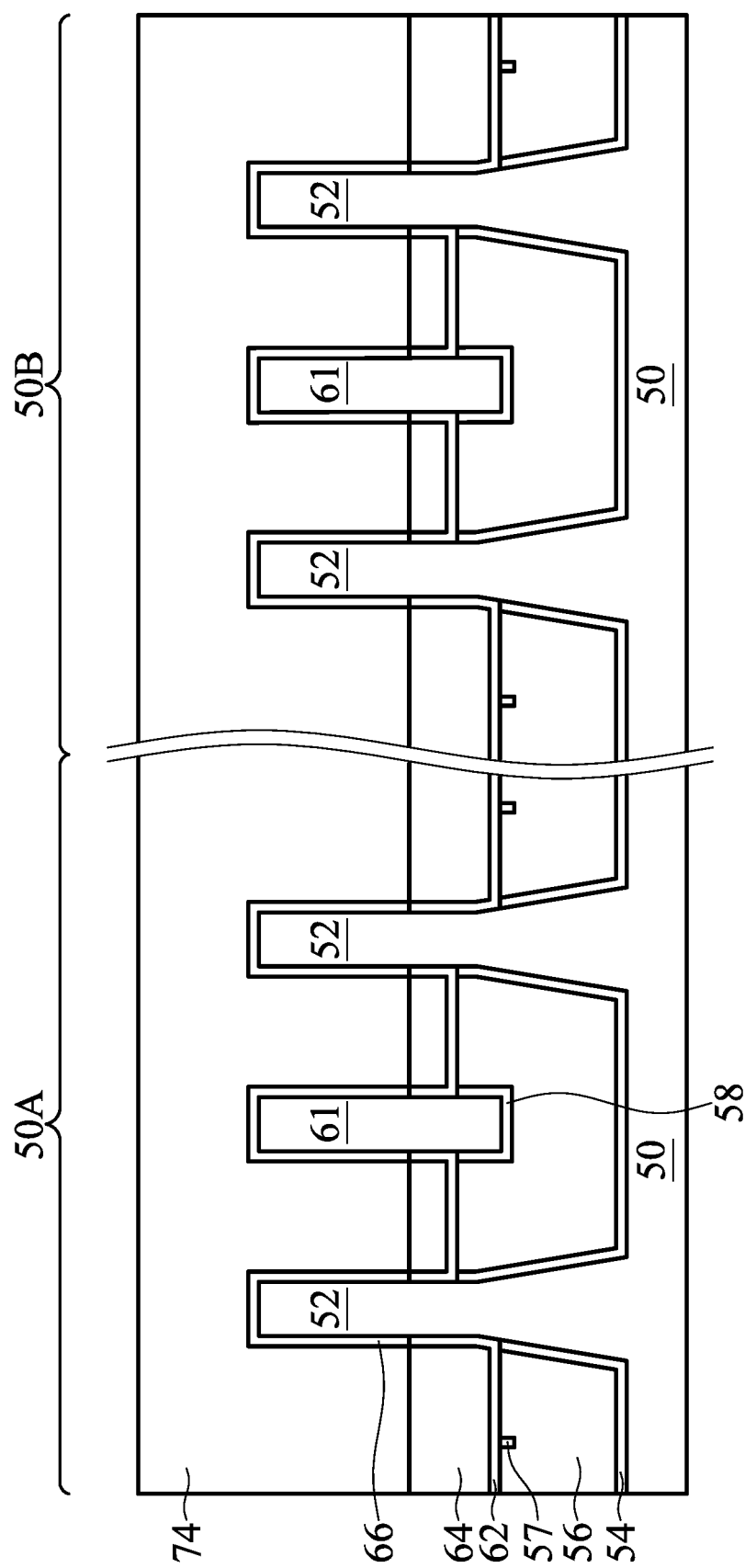
FIGS. 19A and 19B illustrate cross-sectional views of a planarization of the inter-layer dielectric layer and the mask layer in accordance with some embodiments.
Figure 19B:
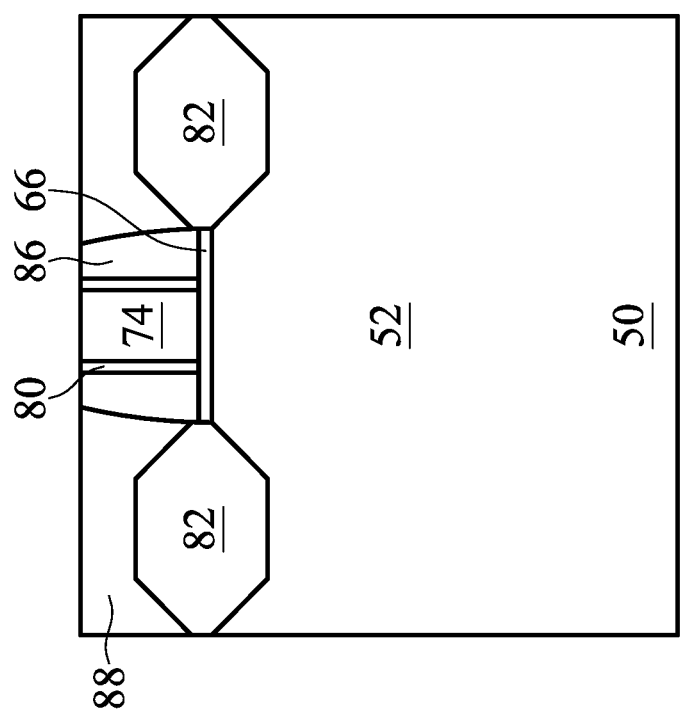

In FIGS. 19A and 19B, a planarization process, such as a CMP, may be performed to level the top surface of the ILD 88 with the top surfaces of the dummy gates 74. In an embodiment, the planarization process is performed using a planarization system. The planarization process may also remove the masks 76 on the dummy gates 74, and portions of the gate seal spacers 80 and the gate spacers 86 along sidewalls of the masks 76. After the planarization process, top surfaces of the dummy gates 74, the gate seal spacers 80, the gate spacers 86, and the ILD 88 are level. Accordingly, the top surfaces of the dummy gates 74 are exposed through the ILD 88.

Figure 20A:
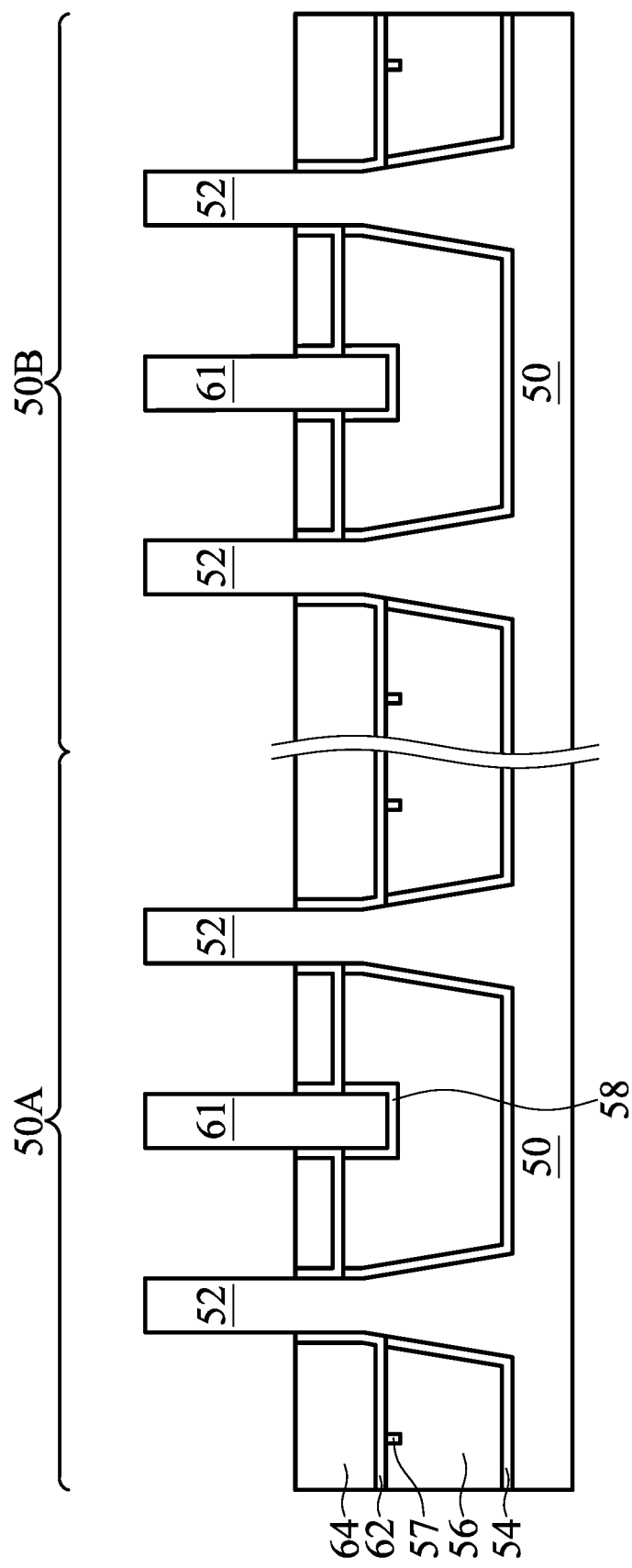
FIGS. 20A and 20B illustrate cross-sectional views of a removal of the dummy gate layer and portions of the dummy dielectric layer in accordance with some embodiments.
Figure 20B:
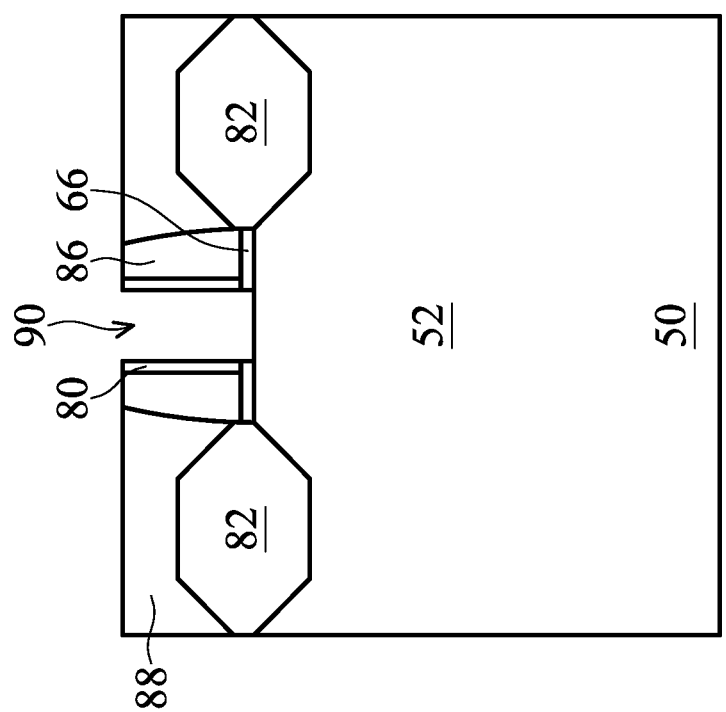

In FIGS. 20A and 20B, the dummy gates 74 and portions of the dummy dielectric layer 66 directly underlying the exposed dummy gates 74 are removed in an etching step(s), so that recesses 90 are formed. In some embodiments, the dummy gates 74 are removed by an anisotropic dry etch process. For example, the etching process may include a dry etch process using reaction gas(es) that selectively etch the dummy gates 74 without etching the ILD 88 or the gate spacers 86. Each recess 90 exposes a channel region of a respective fin 52. Each channel region is disposed between neighboring pairs of the epitaxial source/drain regions 82. During the removal, the dummy dielectric layer 66 may be used as an etch stop layer when the dummy gates 74 are etched. The dummy dielectric layer 66 may then be removed after the removal of the dummy gates 74.

Figure 21A:
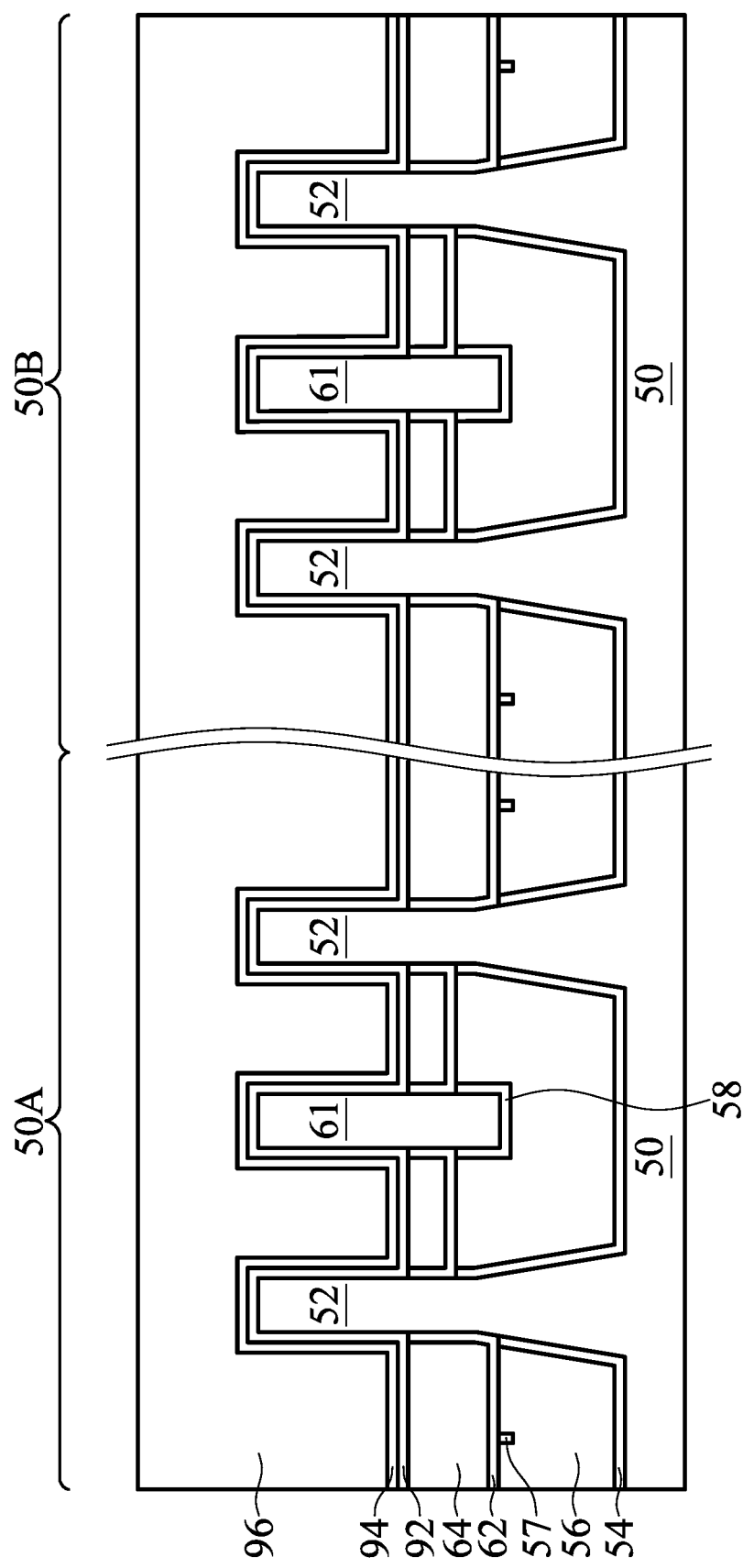
FIGS. 21A and 21B illustrate cross-sectional views of a formation of a gate stack in accordance with some embodiments.
Figure 21B:
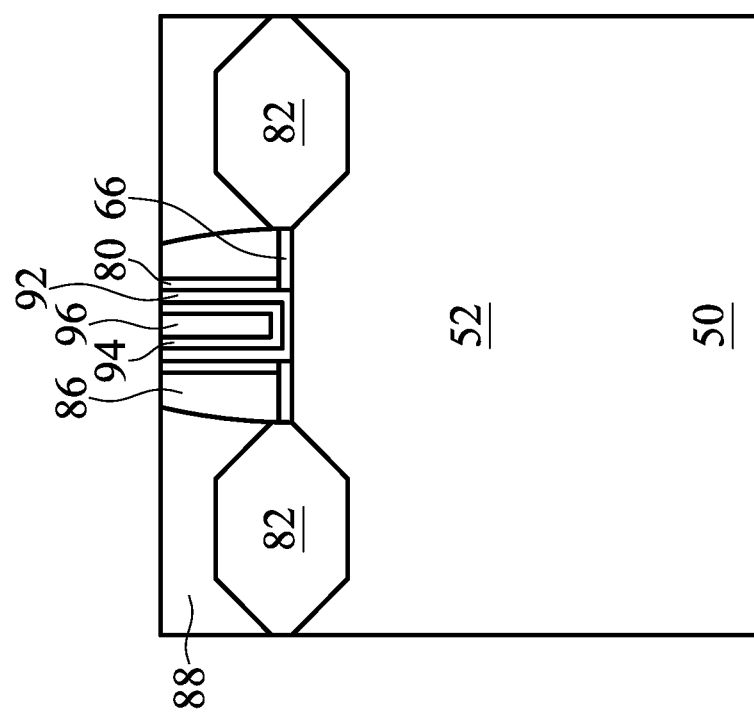

In FIGS. 21A and 21B, gate dielectric layers 92, work function metal layers 94 and gate electrodes 96 are formed for replacement gates. Gate dielectric layers 92 are deposited conformally over the second STI material 64, the third liner 62, the dummy fins 61, the fins 52 and in the recesses 90, such as on the top surfaces and the sidewalls of the fins 52 and on sidewalls of the gate seal spacers 80/gate spacers 86. In accordance with some embodiments, the gate dielectric layers 92 comprise silicon oxide, silicon nitride, or multi-layers thereof. In some embodiments, the gate dielectric layers 92 are a high-k dielectric material, and in these embodiments, the gate dielectric layers 92 may have a k value greater than about 7.0, and may include a metal oxide or a silicate of Hf, Al, Zr, La, Mg, Ba, Ti, Pb, and combinations thereof. The formation methods of the gate dielectric layers 92 may include molecular beam deposition (MBD), ALD, PECVD, and the like.

The work function layers 94 are then formed over the gate dielectric layers 92. The work function layers 94 may be formed of a conductive material and may include one or more barrier layers, work function layers, and/or work function tuning layers to tune the work function of the subsequently formed gate electrodes 96. The work function layers 94 may be a metal-containing material such as Al, TiC, TiN, combinations thereof, or multi-layers thereof.

The gate electrodes 96 are deposited over the work function layers 94, and fill the remaining portions of the recesses adjacent the fins 52 and the dummy fins 61, as well as the remaining portions of the recesses 90. The gate electrodes 96 may be a metal-containing material such as TiN, TaN, TaC, Co, Ru, Al, combinations thereof, or multi-layers thereof. The gate electrodes 96, the work function layers 94, and the gate dielectric layers 92 may be collectively referred to as a "gate" or a "gate stack."

Semiconductor devices including the dummy fins 61 described above may have reduced topography issues, reduced CMP nonconformity issues, and a more uniform structure, which may lead to improved device performance and reduced defects. Moreover, the formation of the STI regions according to the methods described herein may reduce or eliminate recess depth loading in the completed semiconductor devices, which may lead to further reductions in defects and improved device performance.

FIGS. 22 through 26 are cross-sectional views of intermediate stages in the manufacturing of FinFETs, in accordance with additional embodiments. FIGS. 22 through 26 illustrate reference cross-section A-A illustrated in FIG. 1, except for multiple fins/FinFETs. The steps leading up to FIG. 22 may be the same as or similar to those illustrated in FIGS. 2 through 8; therefore, these steps and intermediate structures are not separately illustrated for the additional embodiments. Moreover, the steps following FIG. 26 may be the same as or similar to those illustrated in FIGS. 15A-21B; therefore, these steps and intermediate structures are also not separately illustrated for the additional embodiments.

Figure 22:
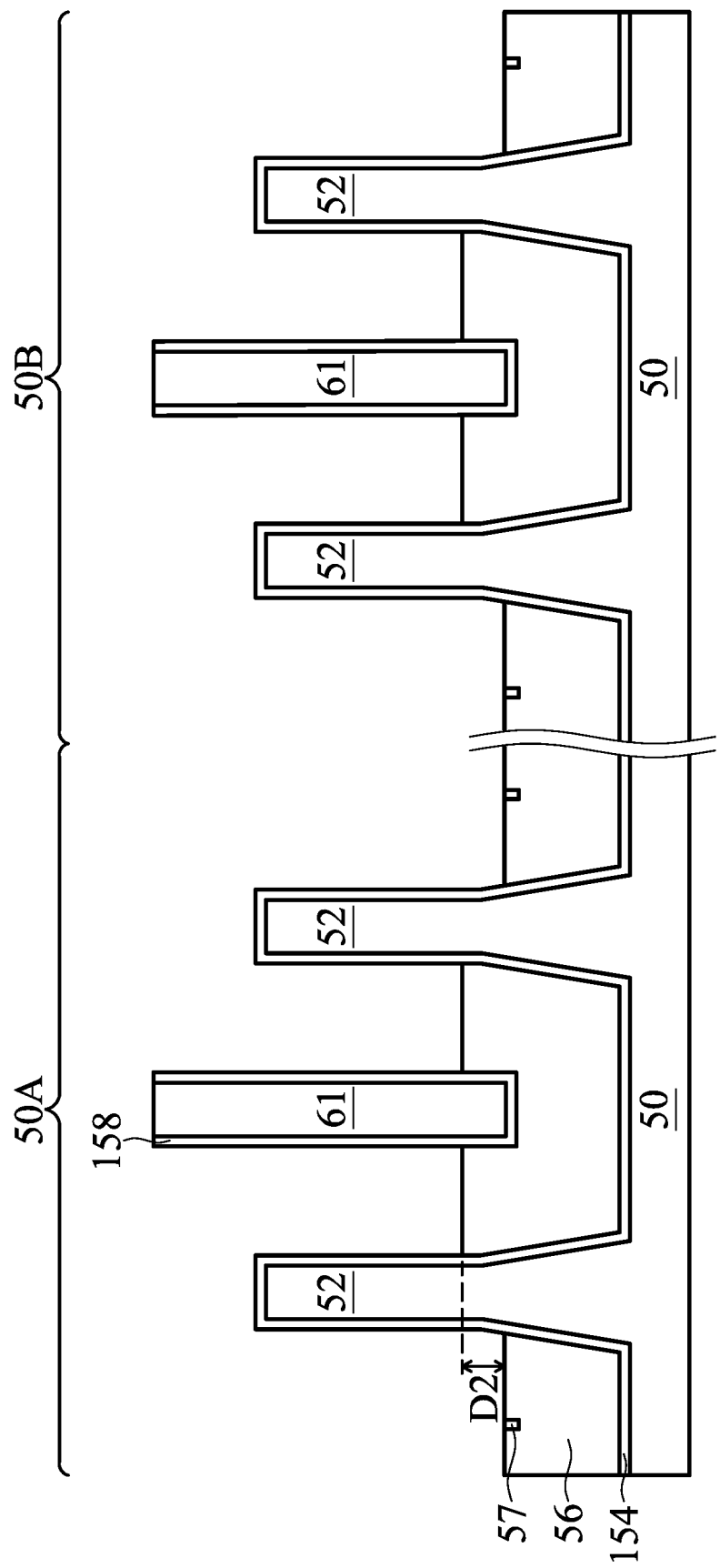
FIG. 22 illustrates a cross-sectional view of a formation of recesses in accordance with additional embodiments.

In FIG. 22, the first STI material 56 of FIG. 8 is etched to form recesses adjacent the fins 52 and the dummy fins 61. The first STI material 56 may be etched using any acceptable etching process, such as a wet etch process, a dry etch process, or the like. The etching process may be selective to the first STI material 56. More specifically, the first STI material 56 may be etched by the selective etch process, while the fins 52, the dummy fins 61, a first liner 154, and a second liner 158 are not etched by the selective etch process. As such, the fins 52, the dummy fins 61, portions of the first liner 154, and portions of the second liner 158 may protrude above the first STI material 56, as illustrated in FIG. 9.

The first liner 154 and the second liner 158 may be formed of the same materials or different materials from the first liner 54 and the second liner 58 of FIG. 8. For example, the first liner 154 may be an oxide, such as silicon oxide ($SiO_2$), a nitride, such as silicon nitride (SiN), the like, or a combination thereof. The second liner 158 may be an oxide, such as silicon oxide ($SiO_2$), a nitride, such as silicon nitride (SiN), the like, or a combination thereof. The first liner 154 and the second liner 158 may be formed of different materials from the first STI material 56 such that the first STI material 56 may be selectively etched without etching the first liner 154 or the second liner 158, as illustrated in FIG. 22. In some specific embodiments, the first liner 154 may be formed of $SiO_2$ and the second liner 158 may be formed of SiCON, such that the first liner 154 and the second liner 158 may be selectively etched.

The first STI material 56 may be etched back by the same or different etch processes and chemistries as the first STI material 56, discussed above in reference to FIGS. 8 and 9. For example, in some embodiments, a plasma-less gaseous etching process (e.g., an etching process using hydrogen fluoride (HF) gas, ammonia ($NH_3$) gas, or the like), a remote plasma assisted dry etch process (e.g., a process using hydrogen ($H_2$), nitrogen trifluoride ($NF_3$), and ammonia by-products, or the like), a wet etch process (e.g., dilute hydrofluoric (dHF) acid, or the like), or the like may be used to the first STI material 56, without etching the first liner 154 or the second liner 158.

As illustrated in FIG. 22, the first STI material 56 may have different etch rates in different areas over the substrate 50. For example, the first STI material 56 may be etched more quickly in areas adjacent the unfilled seam 57 and the first STI material 56 may be etched more slowly in areas adjacent the filled seam 57 including the dummy fins 61. The difference in etch rates in these two areas may result in a height difference D2 between top surfaces of the first STI material 56 in the areas adjacent the unfilled seam 57 and top surfaces of the first STI material 56 in the areas adjacent the filled seam 57. The height difference D2 may be between about 2 nm and about 20 nm, such as about 10 nm.

The height difference D2 may be caused by the unfilled seams 57 speeding up the rate of etching in the areas adjacent the unfilled seams 57. The height difference D2 results in recess depth loading (also referred to as fin height loading or fin depth loading), which causes performance variation as well as defects in completed devices. Top surfaces of the first STI material 56 may have flat surfaces as illustrated, convex surfaces, concave surfaces (such as dishing), or a combination thereof.

Figure 23:
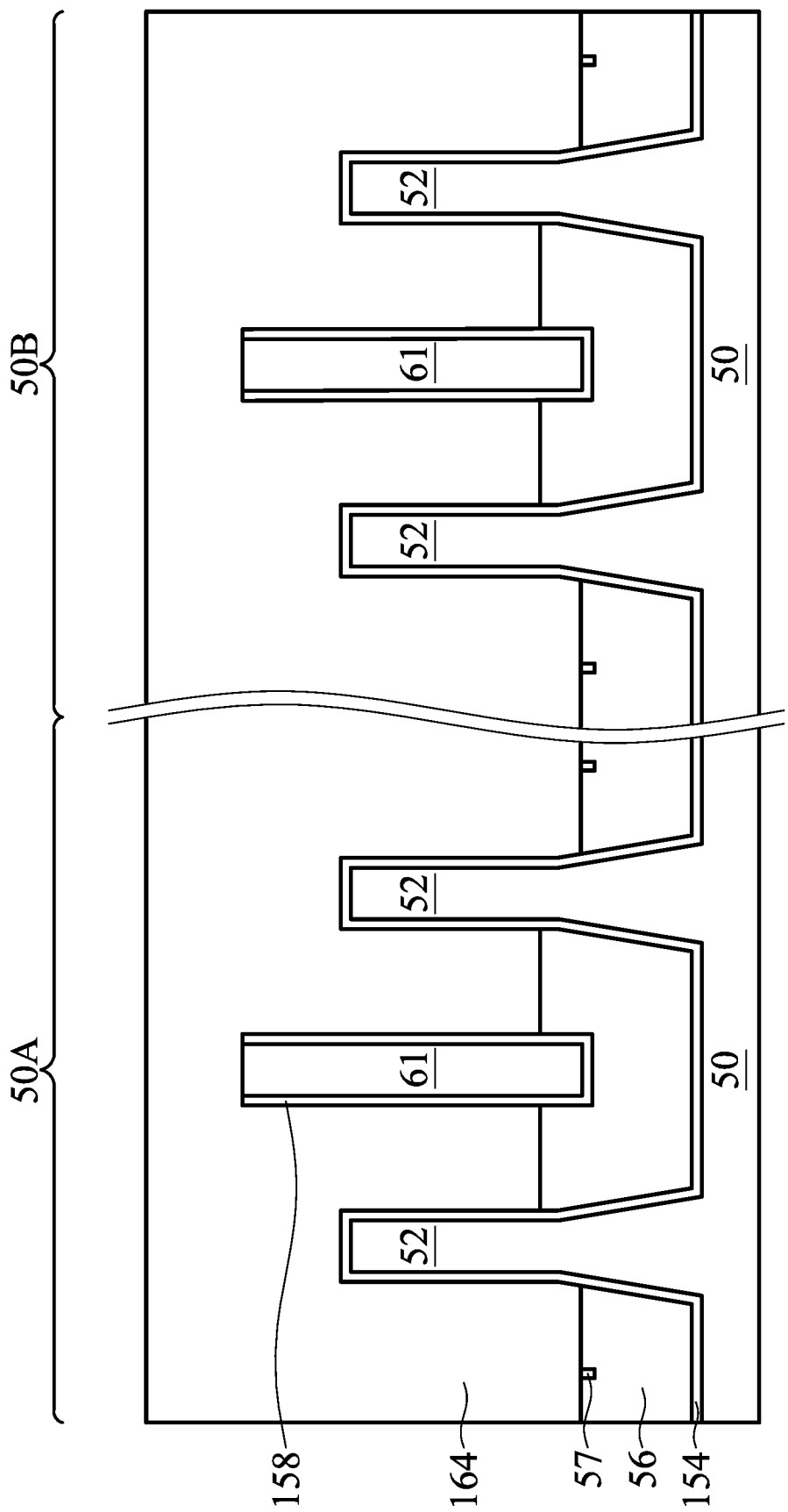
FIG. 23 illustrates a cross-sectional view of a formation of a shallow trench isolation material in accordance with additional embodiments.

In FIG. 23, a second STI material 164 is formed over the first STI material 56, the first liner 154, the second liner 158, the fins 52, and the dummy fins 61. The second STI material 164 may be an oxide, such as silicon oxide ($SiO_2$), a nitride, such as silicon nitride (SiN), the like, or a combination thereof. The second STI material 164 may be deposited as a flowable material (e.g., a liquid material) and may fill the recesses adjacent to the fins 52 and the dummy fins 61. As illustrated in FIG. 23, the second STI material 164 may be deposited such that the second STI material 164 extends above top surfaces of the fins 52 and the dummy fins 61. After the second STI material 164 is deposited, the second STI material 164 may be cured and/or annealed to form a solid material. The second STI material 164 may be annealed at a temperature of between about 200° C. and about 1100° C., such as about 750° C. for a time of between about 20 minutes and about 7 hours, such as about 2 hours. The second STI material 164 may be cured using a process such as UV curing, curing in a vapor chamber, or the like. In embodiments in which the second STI material 164 is cured by UV curing, the second STI material 164 may be cured at a temperature of between about 0° C. and about 50° C. for a period of between about 10 seconds and about 300 seconds. Ozone ($O_3$) may optionally be flowed during the UV curing at a pressure of between about 5 Torr and about 760 Torr. In still further embodiments, the second STI material 164 may be cured in an $H_2O$ vapor chamber at a temperature of between about 10° C. and about 170° C. for a period of between about 10 seconds and about 1,000 seconds. Ozone or oxygen ($O_2$) may optionally be flowed during the vapor chamber curing at a pressure of between about 100 Torr and about 760 Torr. Higher temperatures used for the annealing or curing may correspond to a shorter anneal time/cure time and lower temperatures may correspond to a longer anneal time/cure time. Because the second STI material 164 is deposited as a flowable material, rather than by a conformal process, the second STI material 164 may be deposited without seams or voids formed therein.

Figure 24:
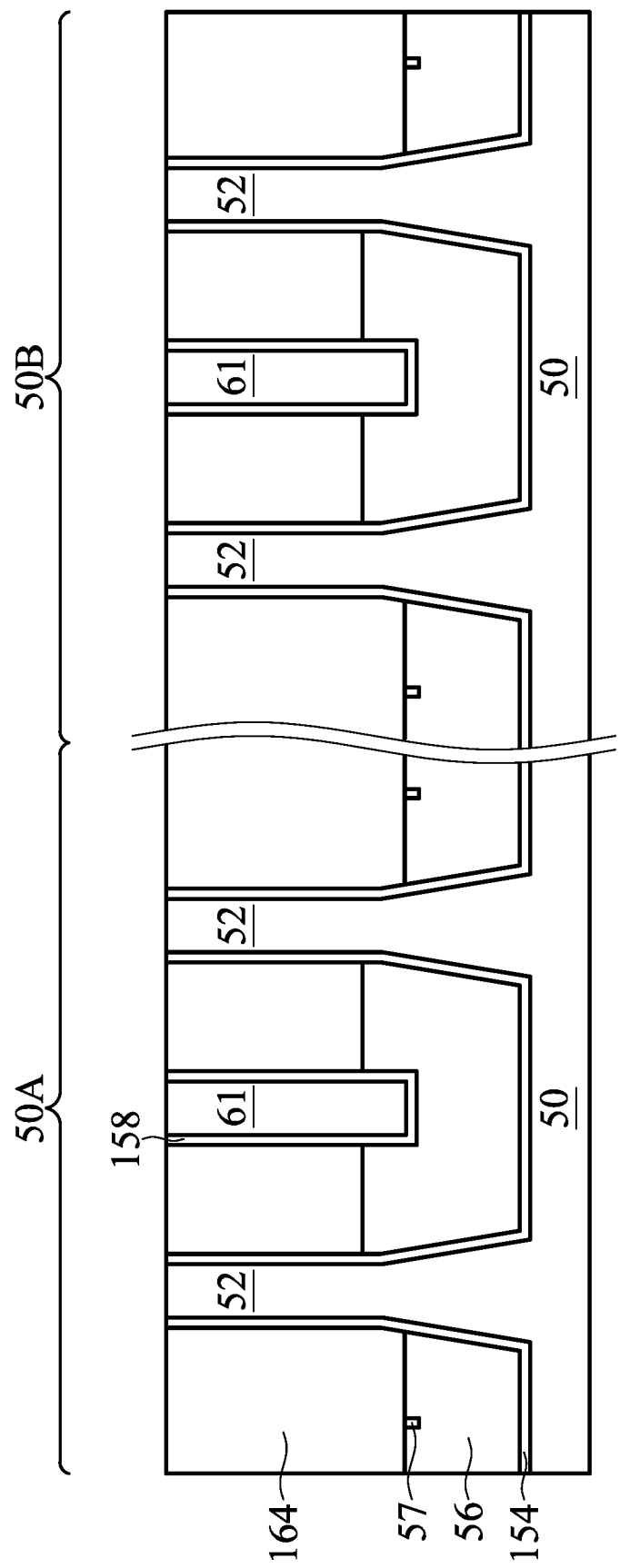
FIG. 24 illustrates a cross-sectional view of a planarization of dummy fins and the shallow trench isolation material in accordance with additional embodiments.

In FIG. 24, the second STI material 164, the first liner 154, the second liner 158, the dummy fins 61, and the fins 52 are planarized by a planarization process. In some embodiments, the planarization process includes a chemical mechanical polish (CMP), an etch-back process, combinations thereof, or the like. As illustrated in FIG. 24, following the planarization process, top surfaces of the second STI material 164, the first liner 154, the second liner 158, the dummy fins 61, and the fins 52 may be co-planar with each other.

Figure 25:
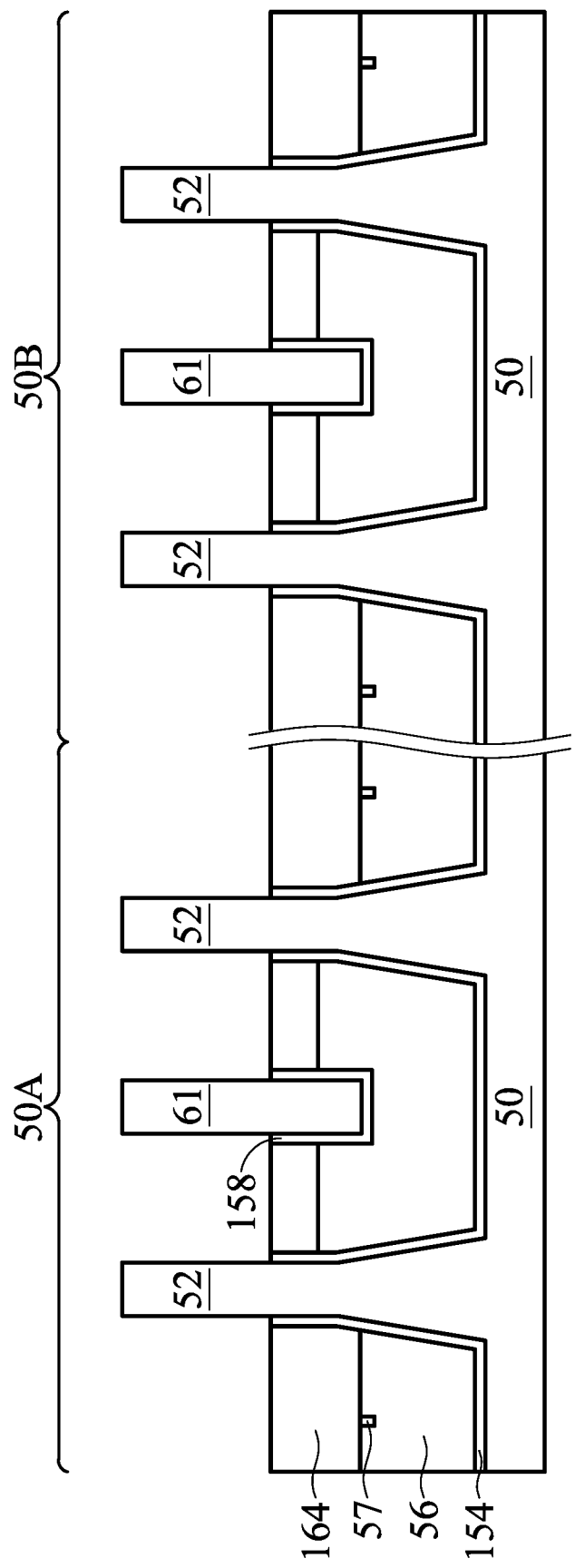
FIG. 25 illustrates a cross-sectional view of a formation of recesses in accordance with additional embodiments.

In FIG. 25, the second STI material 164, the first liner 154, and the second liner 158 are etched to form recesses adjacent the fins 52 and the dummy fins 61. The second STI material 164, the first liner 154, and the second liner 158 may be etched using one or more etch processes. The second STI material 164, the first liner 154, and the second liner 158 may be etched using any acceptable etching process, such as a wet etch process, a dry etch process, or the like. In some embodiments, the etching process is selective to the second STI material 164, the first liner 154, and the second liner 158. More specifically, the second STI material 164, the first liner 154, and the second liner 158 may be etched by the selective etch process, while the fins 52 and the dummy fins 61 are not etched by the selective etch process. As such, the fins 52 and the dummy fins 61 may protrude above the second STI material 164, the first liner 154, and the second liner 158, as illustrated in FIG. 25. In some embodiments, a plasma-less gaseous etching process (e.g., an etching process using hydrogen fluoride (HF) gas, ammonia ($NH_3$) gas, combinations thereof, or the like), a remote plasma assisted dry etch process (e.g., a process using hydrogen ($H_2$), nitrogen trifluoride ($NF_3$), ammonia ($NH_3$) by-products, combinations thereof, or the like), a wet etch process (e.g., dilute hydrofluoric (dHF) acid, or the like), or the like may be used to etch the second STI material 164, the first liner 154, and the second liner 158. The first liner 154, the first STI material 56, the second liner 158, and the second STI material 164 may be collectively referred to as STI regions.

Because the second STI material 164 is formed without seams or voids formed therein, the second STI material 164 may be etched at the same rate in all areas across the substrate 50. As a result, there is no height difference between top surfaces of the second STI material 164 in different areas over the substrate 50. Accordingly, there is no recess depth loading, and performance variations and defects in the resulting devices are reduced. Moreover, the additional embodiments require one less liner layer deposition step (e.g., the deposition of the third liner 62) as compared with the first embodiments. This reduces the cost of forming semiconductor devices by the methods of the additional embodiments.

Figure 26:
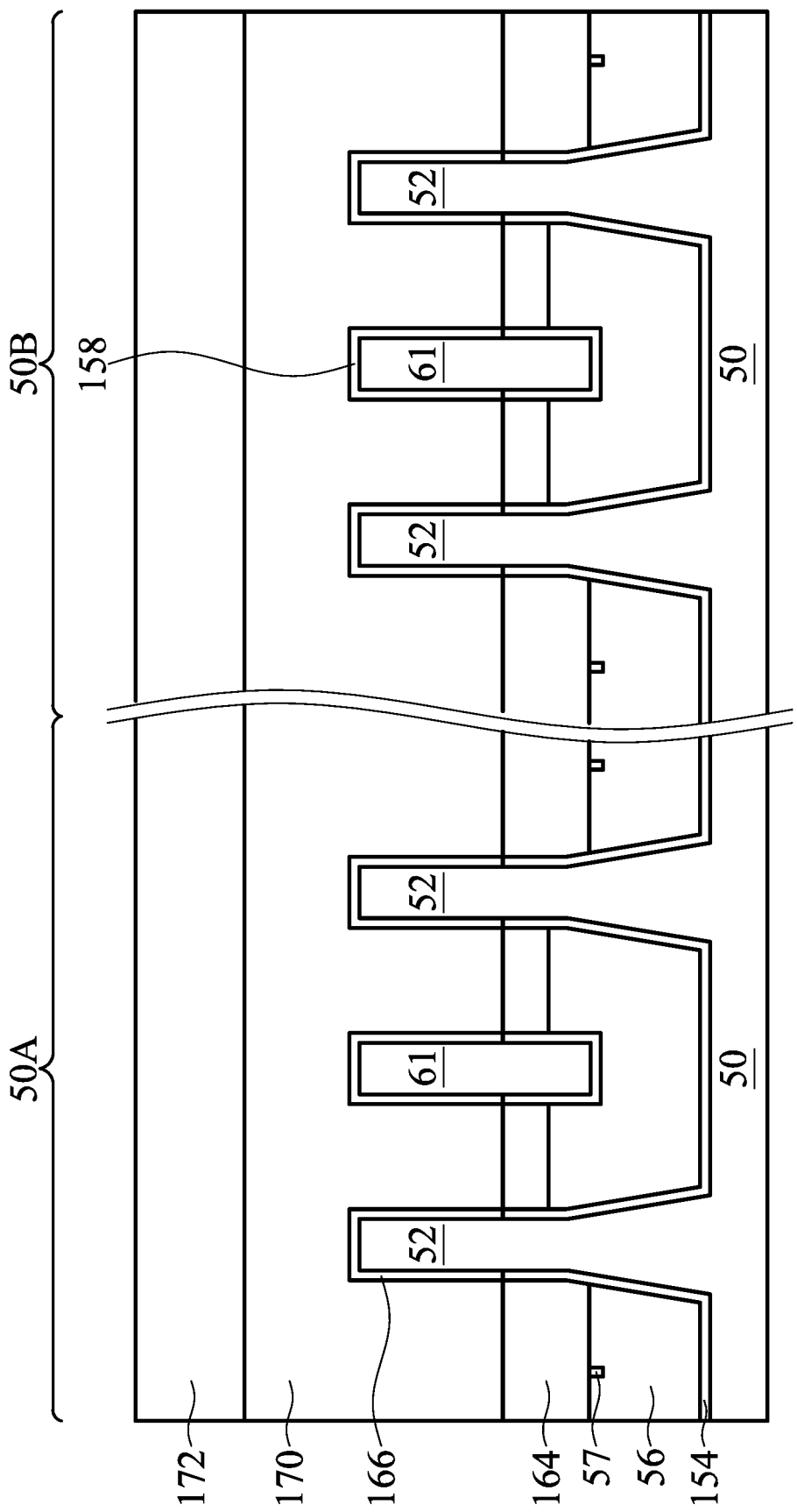
FIG. 26 illustrates a cross-sectional view of a formation of a gate stack in accordance with additional embodiments.

In FIG. 26, a dummy dielectric layer 166 is formed on the fins 52 and the dummy fins 61. The dummy dielectric layer 166 may be, for example, silicon oxide, silicon nitride, a combination thereof, or the like, and may be deposited or thermally grown according to acceptable techniques. A dummy gate layer 170 is formed over the dummy dielectric layer 166, and a mask layer 172 is formed over the dummy gate layer 170. The dummy gate layer 170 may be deposited over the dummy dielectric layer 166 and then planarized, such as by a CMP. The mask layer 172 may be deposited over the dummy gate layer 170. The dummy gate layer 170 may be a conductive material and may be selected from a group including polycrystalline-silicon (polysilicon), polycrystalline silicon-germanium (poly-SiGe), metallic nitrides, metallic silicides, metallic oxides, and metals. In one embodiment, amorphous silicon is deposited and recrystallized to create polysilicon. The dummy gate layer 170 may be deposited by physical vapor deposition (PVD), CVD, sputter deposition, or other techniques known and used in the art for depositing conductive materials. The dummy gate layer 170 may be made of other materials that have a high etching selectivity from the etching of isolation regions. The mask layer 172 may include, for example, SiN, SiON, or the like. In this example, a single dummy gate layer 170 and a single mask layer 172 are formed across the first region 50A and the second region 50B. In some embodiments, separate dummy gate layers may be formed in the first region 50A and the second region 50B, and separate mask layers may be formed in the first region 50A and the second region 50B.

Following FIG. 26, the steps illustrated in FIGS. 15A-21B may be performed on the structure illustrated in FIG. 26 to form FinFET devices including replacement metal gates and source/drain regions. Semiconductor devices formed according to the additional embodiments may include all of the advantages of semiconductor devices according to the first embodiments. For example, semiconductor devices including the dummy fins 61 described above may have reduced topography issues, reduced CMP nonconformity issues, and a more uniform structure, which may lead to improved device performance and reduced defects. Moreover, the formation of the STI regions according to the methods described herein may reduce or eliminate recess depth loading in the completed semiconductor devices, which may lead to further reductions in defects and improved device performance. Furthermore, semiconductor devices formed according to the additional embodiments may have less deposition steps (e.g., no deposition of a third liner 62), which may reduce costs.

In accordance with an embodiment, a method includes forming a trench in a substrate; depositing a first dielectric liner in the trench; depositing a first shallow trench isolation (STI) material over the first dielectric liner, the first STI material being deposited as a conformal layer; etching the first STI material; depositing a second STI material over the first STI material, the second STI material being deposited as a flowable material; and planarizing the second STI material such that top surfaces of the second STI material are co-planar with top surfaces of the substrate. In an embodiment, etching the first STI material further includes etching the first dielectric liner. In an embodiment, the method further includes depositing a second dielectric liner over the first STI material and the first dielectric liner after etching the first STI material, the second STI material being deposited over the second dielectric liner. In an embodiment, the method further includes annealing the second STI material. In an embodiment, the method further includes planarizing the first STI material and the first liner before etching the first STI material. In an embodiment, etching the first STI material includes a selective etch. In an embodiment, depositing the first STI material forms a seam in the first STI material, and the second STI material is deposited void-free. In an embodiment, the method further includes etching the second STI material, the topmost surfaces of the second STI material being level with one another and below the top surfaces of the substrate after etching the second STI material.

In accordance with another embodiment, a method includes forming a first trench on a first side of a fin, the fin extending from a substrate; forming a second trench on a second side of the fin opposite the first side; depositing a first dielectric liner over the first trench, the second trench, and the fin; depositing a first shallow trench isolation (STI) material over the first dielectric liner; after depositing the first STI material, forming a dummy fin over the first STI material; etching the first liner and the first STI material; and depositing a second STI material over the first STI material. In an embodiment, the first trench has a first width, the second trench has a second width, and the first width is greater than the second width. In an embodiment, depositing the first STI material forms a first seam over the first trench, depositing the first STI material forms a second seam over the second trench, the first seam has a greater width than the second seam, and the dummy fin is formed in the first seam. In an embodiment, after etching the first liner and the first STI material, top surfaces of the first liner and the first STI material in the first trench are disposed above top surfaces of the first liner and the first STI material in the second trench. In an embodiment, the method further includes etching the second STI material, and, after etching the second STI material, top surfaces of the second STI material in the first trench are level with top surfaces of the second STI material in the second trench. In an embodiment, forming the dummy fin includes forming a second liner over the first STI material; forming a dummy fin material over the second liner; and planarizing the dummy fin material and the second liner. In an embodiment, the first STI material is deposited by a conformal deposition process, and the second STI material is deposited as a flowable material.

In accordance with yet another embodiment, a semiconductor device includes a fin extending from a semiconductor substrate; a first isolation region on a first side of the fin; and a second isolation region on a second side of the fin opposite the first side, the first isolation region and the second isolation region including a first liner, a first isolation material over the first liner, and a second isolation material over the first isolation material, a top surface of the first isolation material in the first isolation region being disposed at a different level from a top surface of the first isolation material in the second region, and a top surface of the second isolation material in the first region being disposed at the same level as a top surface of the second isolation material in the second region. In an embodiment, the first isolation region has a first width, the second isolation region has a second width, and the first width is greater than the second width. In an embodiment, the top surface of the first isolation material in the first isolation region is disposed below the top surface of the second isolation material in the second region by a distance of greater than 5 nm. In an embodiment, the first isolation region further includes a dielectric fin over the first isolation material, and the second isolation region further includes a void disposed in the first isolation material. In an embodiment, the first liner, the first isolation material, and the second isolation material include silicon oxide or silicon nitride, and the dielectric fin includes silicon carbon nitride.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
    forming a first protrusion and a second protrusion protruding from a substrate;
    forming a first dielectric layer between the first protrusion and the second protrusion, wherein a top of the first dielectric layer is lower than a top of the first protrusion and a top of the second protrusion;
    forming a second dielectric layer over the first dielectric layer, the first protrusion, and the second protrusion, wherein the second dielectric layer is deposited as a flowable material;
    recessing the second dielectric layer to expose a portion of a sidewall of the first protrusion and a portion of a sidewall of the second protrusion; and
    forming a third dielectric layer over the second dielectric layer, the first protrusion, and the second protrusion, wherein the third dielectric layer is in physical contact with the top and the sidewall of the first protrusion and in physical contact with the top and the sidewall of the second protrusion.

2. The method of claim 1, further comprising forming a first dielectric liner over the substrate, the first protrusion, and the second protrusion before forming the first dielectric layer.

3. The method of claim 2, further comprising recessing the first dielectric liner while recessing the second dielectric layer, wherein the top and the portion of the sidewall of the first protrusion and the top and the portion of the sidewall of the second protrusion are exposed before forming the third dielectric layer.

4. The method of claim 1, wherein recessing the second dielectric layer comprises removing the second dielectric layer until exposing the top of the first protrusion and the top of the second protrusion.

5. The method of claim 4, wherein recessing the second dielectric layer comprises performing an etching process to etch the second dielectric layer after the top of the first protrusion and the top of the second protrusion are exposed.

6. The method of claim 1, further comprising:
forming gate spacers over the third dielectric layer;
removing a portion of the third dielectric layer that is not covered by the gate spacers to expose the first protrusion; and
forming a fourth dielectric layer over the first protrusion, wherein the dielectric constant of the fourth dielectric layer is greater than the dielectric constant of the third dielectric layer.

7. The method of claim 1, further comprising:
etching the third dielectric layer, the first protrusion, and the second protrusion; and
forming an epitaxial structure over remaining portions of the first protrusion and the second protrusion.

8. The method of claim 7, further comprising forming a dielectric fin over the first dielectric layer, wherein the dielectric fin overlaps the epitaxial structure in a plan view.

9. A method comprising:
forming fin extending from a substrate;
forming a first shallow trench isolation (STI) structure on a first side of the fin and a second STI structure on a second side of the fin opposite the first STI structure;
forming a dielectric structure over the first STI structure, wherein a bottom surface of the dielectric structure is lower than a first top surface of the first STI structure, wherein after forming the dielectric structure, the first top surface of the first STI structure is higher than a second top surface of the second STI structure; and
forming a third STI structure over the first STI structure and a fourth STI structure over the second STI structure.

10. The method of claim 9, further comprising forming a first dielectric liner over the fin before forming the first STI structure and the second STI structure.

11. The method of claim 9, further comprising forming a second dielectric liner between the dielectric structure and the first STI structure.

12. The method of claim 11, further comprising forming a third dielectric liner over sidewalls of the dielectric structure and in physical contact with the second dielectric liner.

13. The method of claim 12, wherein a portion of the third dielectric liner is removed to expose the fin after forming the first STI structure and the second STI structure, wherein the method further comprising forming a fourth dielectric liner over exposed portions of the fin.

14. The method of claim 13, wherein the fourth dielectric liner extends over a sidewall of the dielectric structure, the first top surface of the first STI structure, and the second top surface of the second STI structure.

15. The method of claim 13, further comprising etching the fourth dielectric liner such that a third top surface of the fourth dielectric liner is lower than the top of the fin after the fourth dielectric liner being etched.

16. The method of claim 9, wherein the dielectric structure comprises a dielectric fin.

17. A method comprising:
forming a semiconductor fin extending from a semiconductor substrate;
depositing a first dielectric liner over the semiconductor fin and the semiconductor substrate;
depositing a first isolation material over the first dielectric liner;
etching the first isolation material to form a first isolation structure on a first side of the semiconductor fin and a second isolation structure on a second side of the semiconductor fin opposite the first side of the semiconductor fin, wherein the first isolation structure has a first width greater than a second width of the second isolation structure;
forming a second dielectric liner over the first isolation structure, the second isolation structure, and the semiconductor fin;
forming a second isolation material covering the semiconductor fin and the second dielectric liner; and
etching the second dielectric liner and the second isolation material, wherein after etching the second dielectric liner and the second isolation material, a top surface of the second dielectric liner is level with the a top surface of the second isolation material, and the semiconductor fin comprises a protrusion protruding over the second dielectric liner and the second isolation material.

18. The method of claim 17, wherein the second dielectric liner is in physical contact with the first dielectric liner.

19. The method of claim 17, further comprising forming a dielectric fin over the first isolation structure and in the second isolation material, wherein the dielectric fin comprises a protrusion protruding over the second dielectric liner and the second isolation material after etching the second dielectric liner and the second isolation material.

20. The method of claim 19, further comprising:
forming a gate dielectric layer over the protrusion of the semiconductor fin and the protrusion of the dielectric fin; and
forming a metal gate over the gate dielectric layer.

* * * * *